US012744982B2

(12) United States Patent
Zhu et al.

(10) Patent No.: US 12,744,982 B2
(45) Date of Patent: Sep. 22, 2026

(54) CAMERA MODULE COMPRISING CIRCUIT BOARD WITH LATERAL CONNECTING BELTS

(71) Applicant: NINGBO SUNNY OPOTECH CO., LTD., Ningbo City (CN)

(72) Inventors: Haijiang Zhu, Ningbo City (CN); Yihang Lao, Ningbo City (CN); Yafei Zhu, Ningbo City (CN); Junlong Nie, Ningbo City (CN); Yongming Chen, Ningbo City (CN); Wei Li, Ningbo City (CN); Dike Fan, Ningbo City (CN); Hangang Wei, Ningbo City (CN); Yi Yang, Ningbo City (CN); Sisi Yu, Ningbo City (CN); Chunmei Liu, Ningbo City (CN); Kaikai Zhao, Ningbo City (CN); Yurong Wu, Ningbo City (CN)

(73) Assignee: NINGBO SUNNY OPOTECH CO., LTD., Ningbo City (CN)

( * ) Notice: Subject to any disclaimer, the term of this patent is extended or adjusted under 35 U.S.C. 154(b) by 201 days.

(21) Appl. No.: 18/689,396

(22) PCT Filed: Sep. 9, 2022

(86) PCT No.: PCT/CN2022/118119

§ 371 (c)(1),
(2) Date: Jul. 23, 2024

(87) PCT Pub. No.: WO2023/036295

PCT Pub. Date: Mar. 16, 2023

(65) Prior Publication Data

US 2025/0280185 A1 Sep. 4, 2025

(30) Foreign Application Priority Data

Sep. 10, 2021 (CN) ........................ 202111060876.1
Sep. 10, 2021 (CN) ........................ 202111061007.0
(Continued)

(51) Int. Cl.
*H04N 5/335* (2011.01)
*H04N 23/54* (2023.01)
(Continued)

(52) U.S. Cl.
CPC ............. *H04N 23/54* (2023.01); *H04N 23/55* (2023.01); *H05K 1/147* (2013.01); *H05K 3/328* (2013.01);
(Continued)

(58) Field of Classification Search
CPC ..................................................... H05K 1/147
See application file for complete search history.

(56) References Cited

U.S. PATENT DOCUMENTS

2015/0229843 A1 8/2015 Shimizu
2019/0289180 A1 9/2019 Wang
(Continued)

FOREIGN PATENT DOCUMENTS

CN 103222257 A 7/2013
CN 103607535 A 2/2014
(Continued)

*Primary Examiner* — Gary C Vieaux
(74) *Attorney, Agent, or Firm* — Che-Yang Chen

(57) ABSTRACT

Disclosed is a circuit board for a camera module including a circuit board body and at least two lateral connecting belts, wherein the lateral connecting belts are led out from the side surfaces of the circuit board body and bend upwards, and, after being bent, extend on the side surfaces of a camera module to form lateral connecting belt bodies, an outer surface of a hard plate of one of the lateral connecting belts
(Continued)

is provided with a plurality of bonding pads, and the hard plate of the other lateral connecting belt has a plurality of conductive holes, so that the movement resistance of a circuit board body and a photosensitive chip can be reduced, while the yield and production efficiency are improved.

20 Claims, 11 Drawing Sheets

(30) Foreign Application Priority Data

Sep. 10, 2021 (CN) ......................... 202111061548.3
Sep. 10, 2021 (CN) ......................... 202111064738.0

(51) Int. Cl.
*H04N 23/55* (2023.01)
*H05K 1/14* (2006.01)
*H05K 3/328* (2026.01)

(52) U.S. Cl.
CPC .................. *H05K 2201/095* (2013.01); *H05K 2201/10121* (2013.01); *H05K 2201/2009* (2013.01)

(56) References Cited

U.S. PATENT DOCUMENTS

| | | | | |
|---|---|---|---|---|
| 2019/0357352 | A1 | 11/2019 | Rothenhaeusler et al. | |
| 2020/0036898 | A1* | 1/2020 | Kuo | H04N 23/55 |
| 2020/0077517 | A1 | 3/2020 | Li et al. | |
| 2021/0185201 | A1 | 6/2021 | Ta Van et al. | |
| 2023/0418086 | A1* | 12/2023 | Wang | G03B 13/36 |

FOREIGN PATENT DOCUMENTS

| | | | | | |
|---|---|---|---|---|---|
| CN | 206728144 | U | | 12/2017 | |
| CN | 208353432 | U | | 1/2019 | |
| CN | 109477999 | A | | 3/2019 | |
| CN | 208638447 | U | | 3/2019 | |
| CN | 208782913 | U | | 4/2019 | |
| CN | 209659431 | U | | 11/2019 | |
| CN | 110661937 | A | | 1/2020 | |
| CN | 210016539 | U | | 2/2020 | |
| CN | 111405743 | A | | 7/2020 | |
| CN | 111665677 | A | | 9/2020 | |
| CN | 111917955 | A | | 11/2020 | |
| CN | 212211129 | U | | 12/2020 | |
| CN | 112422774 | A | | 2/2021 | |
| CN | 213028255 | U | | 4/2021 | |
| CN | 112886788 | A | * | 6/2021 | H02K 41/0354 |
| CN | 112887456 | A | | 6/2021 | |
| CN | 113055554 | A | | 6/2021 | |
| CN | 113259548 | A | | 8/2021 | |
| CN | 213990805 | U | | 8/2021 | |
| CN | 113347344 | A | | 9/2021 | |
| CN | 114428435 | A1 | | 5/2022 | |
| CN | 114520858 | A | | 5/2022 | |
| CN | 114554068 | A1 | | 5/2022 | |
| CN | 115022502 | A | * | 9/2022 | |
| EP | 4231623 | A1 | | 8/2023 | |
| JP | 2007293052 | A | | 11/2007 | |
| KR | 20080017897 | A | | 2/2008 | |
| KR | 100835068 | B1 | | 6/2008 | |
| KR | 20150033088 | A | | 4/2015 | |
| WO | 2016180378 | A2 | | 11/2016 | |
| WO | 2018035943 | A1 | | 3/2018 | |
| WO | 2018113794 | A2 | | 6/2018 | |
| WO | 2020029781 | A1 | | 2/2020 | |
| WO | 2021108972 | A1 | | 6/2021 | |
| WO | 2021115440 | A1 | | 6/2021 | |
| WO | 2021143410 | A1 | | 7/2021 | |

* cited by examiner

CAMERA MODULE COMPRISING CIRCUIT BOARD WITH LATERAL CONNECTING BELTS

CROSS REFERENCE OF RELATED APPLICATIONS

This application is a U.S. National Stage under 35 U.S.C. 371 of the International Application Number PCT/CN2022/118119, filed on Sep. 9, 2022, which claims priority under 35 U.S.C. 119 to Chinese Patent Application No. 202111060876.1, filed on Sep. 10, 2021 and titled "circuit board for camera module and corresponding camera module", Chinese Patent Application No. 202111061548.3, filed on Sep. 10, 2021 and titled "camera module", Chinese Patent Application No. 202111064738.0, filed on Sep. 10, 2021 and titled "camera module", and Chinese Patent Application No. 202111061007.0, filed on Sep. 10, 2021 and titled "circuit board for camera module and corresponding camera module", the contents of which are incorporated herein by reference in their entirety.

FIELD OF INVENTION

The present invention relates to the technical field of camera modules, in particular, the present invention relates to a circuit board for camera module and corresponding camera module, wherein the present invention improves the structure, position and assembly means of the circuit board.

DESCRIPTION OF RELATED ARTS

The mobile phone camera module is one of the important components of intelligent equipment, and its application range and application volume in the market continue to grow. With the advancement of technology, intelligence is being advocated in both work and life, and one of the important prerequisites for realizing intelligence is to be able to achieve good interaction with the external environment, wherein one of the important ways to achieve good interaction is visual perception, and the visual perception is mainly dependent on the camera module. It can be said that the camera module has changed from an ordinary intelligent equipment accessory to one of the crucial components of intelligent equipment.

As the imaging quality requirements of mobile phone camera modules are getting higher and higher, and the volume and weight of lenses are getting larger and larger, the driving force requirements for motors (i.e., optical actuators) are also getting higher and higher. However, current electronic devices (such as mobile phones) also have a great limitation on the volume of the camera module, and the volume occupied by the motor increases correspondingly with the increase of the lens. In other words, with the trend of lenses becoming larger and heavier, it is difficult for the driving force provided by the motor to increase accordingly. Under the premise that the driving force is limited, the heavier the lens, the shorter the distance that the motor can drive the lens to move, this affects the anti-shake capability. On the other hand, the heavier the lens, the slower the motor can drive the lens to move, and the longer it takes for the lens to reach the predetermined compensation position, which also affects the anti-shake effect.

In order to overcome the above mentioned defects, the applicant proposed a dual OIS motor (OIS is an English abbreviation for optical image stabilization, sometimes also called optical anti-shake), wherein the motor is provided with two portions, one of which is used to drive the optical lens to move, and the other portion is used to drive the photosensitive chip to move. Simultaneously driving the optical lens and the photosensitive chip to move can achieve better anti-shake effect. However, in the traditional solution, the photosensitive chip is attached to the circuit board, and the connecting belt on the circuit board will cause relatively high resistance force to the movement of the photosensitive chip. Specifically, in the traditional solution, the circuit board is usually a combination plate with flexible plate and hard plate, wherein the hard plate portion is the main body of the circuit board, and the flexible plate portion is let out from the side surface of the main body to form a connecting belt, and the tail end (i.e. the free end) of the connecting belt can be provided with a connector for be plugged into the mainboard of the mobile phone. For example, the connector at the tail end of the connecting belt can be configured as a pin array, and a corresponding socket-shaped connector is provided on the mainboard of the mobile phone, wherein the electrical connection between the circuit board of the camera module and the mainboard of the mobile phone is realized by the plug-in connection between the pins and the socket. One end of the connecting belt of the above mentioned traditional circuit board is fixed on the mainboard of the mobile phone. When the photosensitive chip moves, the main body of the circuit board will also move accordingly, while the connecting belt on its side surface will be pulled by the connector, thereby forming relatively high resistance force. During the anti-shake movement, the resistance force of the connecting belt will cause the optical actuator to provide a greater driving force, which is not conducive to the miniaturization of the camera module. On the other hand, the resistance force of the connection strap is irregular and may also cause the accuracy of the anti-shake movement to decrease. Furthermore, the dual OIS motor has a more complex motor structure, resulting in an increase in the wiring area required for the circuit board. If the traditional solution of stacking more layers of PCB boards is used to increase the wiring area, the height of the camera module will increase.

Further, the applicant proposed a solution that the lateral connecting belts are let out respectively from the symmetrical two side surfaces of the main body of the circuit board to overcome the above mentioned defects. The surfaces of the two lateral connecting belts are approximately perpendicular to the surface of the main body of the circuit board, and the lateral connecting belts and the main body of the circuit board form a bending portion through an upwardly bent flexible plate, and the lateral connecting belts can be hung on the fixing portion of the optical actuator. This new circuit board design solution can reduce the resistance force caused by the connecting belt for being connected with the mainboard of the mobile phone to the movement of the main body of the circuit board. However, this brand-new circuit board structure still has many problems such as low yield rate and insufficient production efficiency during actual assembly. Therefore, it is necessary to further optimize the structure of the circuit board so as to improve the yield rate and the production efficiency of the camera module while reducing the resistance force of the connecting belt. For example, the structure of the circuit board can be designed to be more suitable for automatic production, and the production efficiency can be improved through the automatic production. Another example is to improve the shape of the structure of the camera module and its circuit board by analyzing and finding the main reasons that affect the yield rate of the camera module, and finally improve the yield rate of the finished camera module products.

Furthermore, the height direction of the camera module is usually the thickness direction of electronic devices such as mobile phones, so the height of the camera module directly affects the thickness of the mobile phone or other electronic devices equipped with the camera module. For a camera module with dual OIS function, since the optical actuator needs to be provided with a chip anti-shake portion and a lens anti-shake portion at the same time, it may occupy a large space in the height direction. Therefore, there is an urgent need for a solution capable of reducing the height of the camera module.

SUMMARY OF THE PRESENT INVENTION

The object of the present invention is to overcome the deficiencies of the prior art and provide a circuit board and camera module solution that can reduce the movement resistance force of the circuit board body and the photosensitive chip, has a high yield rate and high production efficiency.

In order to solve the above mentioned technical problems, the present invention provides a circuit board for a camera module, which comprises a circuit board body and at least two lateral connecting belts. The circuit board body has a surface perpendicular to an optical axis of the camera module and a plurality of side surfaces parallel to the optical axis. The lateral connecting belts are led out from the side surfaces of the circuit board body and bend upwards, and extend on the side surfaces of the camera module to form lateral connecting belt bodies after being bent; wherein the lateral connecting belts are provided with a hard plate, wherein among the at least two lateral connecting belts, the outer surface of the hard plate of one of the lateral connecting belts is provided with a plurality of bonding pads, and the hard plate of the other lateral connecting belt has a plurality of conductive holes, wherein the hard plates of the two lateral connecting belts are overlapped each other; wherein a welding medium is attached to a sidewall of the conductive holes and passed through the conductive holes to be contacted with the corresponding bonding pads.

Wherein, the plurality of side surfaces comprise a first side surface, a second side surface opposite to the first side surface, a third side surface adjacent to the first side surface, and a fourth side surface opposite to the third side surface; The lateral connecting belts comprise: a first connecting belt comprising a first connecting belt flexible plate and a first connecting belt hard plate, wherein the first connecting belt flexible plate is led out from the first side surface of the circuit board body and bent upwardly, and then is extended along the first side surface, and then is bent to the third side surface, the first connecting belt hard plate is located on the third side surface and the side surface of the first connecting belt hard plate is connected with the first connecting belt flexible plate, and the surface of the first connecting belt hard plate is parallel to the optical axis; and a second connecting belt comprising a second connecting belt flexible plate and a second connecting belt hard plate, wherein the second connecting belt flexible plate is led out from the second side surface of the circuit board body and bent upwardly, and then is extended along the second side surface, and then is bent to the third side surface, the second connecting belt hard plate is located on the third side surface and the side surface of the second connecting belt hard plate is connected with the second connecting belt flexible plate, and the surface of the second connecting belt hard plate is parallel to the optical axis; wherein, the first connecting belt hard plate is located on the outer side of the second connecting belt hard plate, the first connecting belt hard plate has a plurality of conductive holes, the outer surface of the second connecting belt hard plate is provided with a plurality of bonding pads, the conductive holes and the bonding pads are connected by the welding medium, the welding medium is sprayed into and through the conductive holes in a molten state and attached to the bonding pads and the conductive holes after cooling to electrically connect the conductive holes with the bonding pads.

Wherein, the first connecting belt hard plate and the second connecting belt hard plate are bonded by an adhesive medium; and a gap not greater than 100 μm is provided between the inner surface of the first connecting belt hard plate and the outer surface of the second connecting belt hard plate.

Wherein, the welding medium enters the conductive holes in the form of a jet stream in a molten state and is attached to the sidewalls of the conductive holes, and the welding medium is passed through one of the conductive holes to be contacted with a corresponding bonding pad; and the welding medium forms a connecting member spanning the gap between the inner surface of the first connecting belt hard plate and the outer surface of the second connecting belt hard plate after solidification; a gap is remained between the welding medium and a part of the hole wall of the conductive hole.

Wherein, a metal layer is attached to the hole wall of the conductive hole, and the metal layer is a metal plating layer.

Wherein, the metal layer is a ring-shaped metal layer.

Wherein the metal layer is attached to a part of the hole wall of the conductive hole to form an unclosed metal layer.

Wherein, in the first connecting belt hard plate and all of the unclosed metal layers of the conductive holes are arranged on a same side of the conductive holes.

Wherein, in the first connecting belt hard plate and all of the arc-shaped metal layers of the conductive holes are arranged on a lower side of the conductive holes.

Wherein, the welding medium is tin or a solder material containing tin.

Wherein the circuit board further comprises a third connecting belt let out from the lower side surface of the first connecting belt hard plate and bent outwardly, the surface of the third connecting belt is perpendicular to the optical axis, and the free end of the third connecting belt is provided with a connector, and the connector is adapted to be plugged into the mainboard of the electronic device equipped with the camera module.

According to another aspect of the present application, the present invention further provides a camera module, which comprises: an outer frame and an optical lens, an optical actuator, a photosensitive chip and the circuit board according to any one of the aforementioned solutions accommodated inside the outer frame; wherein, the photosensitive chip is fixed on the circuit board body of the circuit board, and the optical actuator is adapted to drive the optical lens and/or the photosensitive chip to move; the optical actuator comprises an actuator fixing portion, and the lateral connecting belts are arranged in the gap between the outer frame and the actuator fixing portion.

Wherein, the photosensitive chip is attached to the upper surface of the circuit board body; a ring-shaped base is disposed on the upper surface of the circuit board, the ring-shaped base surrounds the photosensitive chip, the top surface of the ring-shaped base is installed at an optical filter, and the optical filter, the ring-shaped base and the circuit board body form a closed cavity, and the photosensitive chip is packaged inside the closed cavity.

Wherein, a central through hole is provided in the center of the circuit board body, a reinforcing plate is attached to the lower surface of the circuit board body, the photosensitive chip is attached to the upper surface of the reinforcing plate and the photosensitive chip is disposed in the central through hole; a ring-shaped base is disposed on the upper surface of the circuit board body, the ring-shaped base surrounds the photosensitive chip, the top surface of the ring-shaped base is installed at an optical filter, and the optical filter, the ring-shaped base, the circuit board body and the reinforcing plate form a closed cavity, and the photosensitive chip is packaged inside the closed cavity.

Wherein, the optical actuator further comprises a chip anti-shake movable portion, a photosensitive package composed of the circuit board body, the optical filter, the ring-shaped base and the photosensitive chip is fixed to the chip anti-shake movable portion, the photosensitive package is adapted to move relative to the actuator fixing portion driven by the chip anti-shake movable portion, and the first connecting belt hard plate and the second connecting belt hard plate are both directly or indirectly fixed to the actuator fixing portion.

Wherein, the optical actuator further comprises a chip anti-shake movable portion, the photosensitive package composed of the circuit board body, the optical filter, the ring-shaped base, the reinforcing plate and the photosensitive chip is fixed to the chip anti-shake movable portion, the photosensitive package is adapted to move relative to the actuator fixing portion driven by the chip anti-shake movable portion, and the first connecting belt hard plate and the second connecting belt hard plate are both directly or indirectly fixed to the actuator fixing portion.

Wherein, the optical actuator further comprises a lens driving movable portion, the optical lens is installed on the lens driving movable portion, and is adapted to move relative to the actuator fixing portion driven by the lens driving movable portion.

Wherein, the outer surface of the actuator fixing portion is provided with a convex column rising outwards, the hard plate of the lateral connecting belt has a hanging hole, and the convex column passes through the hanging hole to hang the lateral connecting belt on the actuator fixing portion.

Compared with the prior art, the present application has at least one of the following technical effects:

1. In some embodiments of the present application, a plurality of lateral connecting belts are let out from different sides of the circuit board body of the camera module, and closed on the side surface of the camera module, and the hard plate of the lateral connecting belt can be hung on the actuator fixing portion (the actuator fixing portion can comprise a chip anti-shake fixing portion and a lens driving fixing portion fixed together). This design can significantly reduce the resistance force caused by the connecting belts to the movement of the circuit board body, and is particularly suitable for camera modules with chip anti-shake function. Furthermore, in the present application, an innovative non-plug-in method is used to achieve the electrical connection at the closure of the lateral connecting belts, so as to prevent the optical actuator or the optical element from being squeezed laterally during the insertion process, as well as the resulting decrease in imaging quality of the camera module.

2. In some embodiments of the present application, for the two lateral connecting belts that require electrical connection, the welding medium can be injected from the outer side in the form of a high-temperature jet stream and pass through the conductive holes, and after cooling, the welding medium can be attached on the sidewalls of the conductive holes and passed through the conductive holes to be contacted with the bonding pads, thereby achieving the electrical connection of the two lateral connecting belts of the side surfaces in a non-plug-in manner. Herein, for various plate-shaped components disposed on the side surface of the camera module, the side close to the optical axis of the camera module is the inner side, and the side away from the optical axis is the outer side.

3. In some embodiments of the present application, the conductive hole can be arranged with a conductive layer that is easy to fuse with the welding medium only on a part of sections of the hole wall thereof, so that the welding medium can only be attached to a part of sections of the hole wall of the conductive hole, while leaving a gap in the other part of sections, to facilitate observing whether the welding medium is in contact with the bonding pad from the outer side through the gap, thereby helping to improve the yield.

4. In some embodiments of the present application, the hard plates of the two lateral connecting belts may be bonded by the double-sided tape, and a gap less than 100 μm is provided between the two hard plates. In other words, during the welding process, there is no need to rely on external instruments to press the two hard plates, which facilitates avoiding lateral extrusion of the optical actuator or optical elements as well as the resulting decrease in imaging quality of the camera module. At the same time, it is also easy to assemble, which facilitates improving production efficiency.

5. In some embodiments of the present application, the welding medium does not block the conductive hole, and on at least one section of the hole wall of the conductive hole, the welding medium does not connect the hole wall of the conductive hole. In this way, that is, the welding medium does not block the conductive hole, so that the bonding pad of the hard plate located on the inner side can be exposed to the outside world, thereby providing an observation channel for observing the state of the bonding pad. The operator can observe whether the welding medium is effectively in contact with the bonding pad by eyes, and if there is no effective contact with the bonding pad, it can be judged as defective product (NG product).

6. In some embodiments of the present application, the image of the bonding pad area can be taken through the gap between the hole wall of the conductive hole and the welding medium through the shooting device arranged on the outer side, and whether the welding medium contacted with the bonding pad can be automatically identified based on the Al algorithm, thereby taking measures to improve the yield rate.

7. In some embodiments of the present application, the circuit board structure of the camera module is provided with at least two lateral hard plates, and these lateral hard plates achieve electrical connection based on a conductive hole-pad structure. Compared with the traditional electrical connection of the connector plug-in method, this new connection method can prevent the optical actuator or the optical element from being squeezed laterally during the insertion process, as well as the resulting decrease in imaging quality of the camera module.

8. In some embodiments of the present application, the circuit board structure can be arranged not only below the photosensitive chip, but also in the space around the optical lens, the optical actuator and the photosensitive assembly. For example, in some embodiments, part of the circuit board structure can be arranged in the gap between the actuator fixing portion and the outer frame, so that the wiring area of the circuit board structure can be increased without increasing the height of the camera module.

9. In some embodiments of the present application, for the two lateral connecting belts that require electrical connection, the welding medium can be injected from the outer side in the form of a high-temperature jet stream and pass through the conductive holes, and after cooling, the welding medium is attached on the sidewalls of the conductive holes and passed through the conductive holes to be contacted with the bonding pad, thereby achieving the electrical connection of the two lateral connecting belts of the side surfaces in a non-plug-in manner. Herein, for various plate-shaped components disposed on the side surface of the camera module, the side close to the optical axis of the camera module is the inner side, and the side away from the optical axis is the outer side.

10. Some embodiments of the present application improve the connection structure between the circuit board of the photosensitive assembly and the motor (optical actuator) pin, and improve the traditional pad-pin type welding structure into an side concaving portion-pin type welding structure, thereby reducing the space in the height direction of the module occupied by the motor pin welding structure, and further reducing the height of the camera module.

11. Some embodiments of the present application are particularly suitable for dual OIS camera modules, wherein the optical actuator of the dual OIS camera module is provided with two sets of anti-shake structures composed of the chip anti-shake portion and the lens anti-shake portion, the chip anti-shake portion usually needs to be placed very close to the photosensitive chip, so by providing the side concaving portion on the side surface of the circuit board, the motor pin can be avoided, thereby effectively reducing the space in the height direction of the module occupied by the motor pin welding structure.

12. In some embodiments of the present application, the side concaving portion-pin type welding structure can be used in conjunction with the hanging type circuit board structure. In the hanging type circuit board structure, the surface of the circuit board body is perpendicular to the optical axis of the camera module, the hanging portion of the circuit board may comprise one or more hard plates, and the surface of the hard plate is parallel to the optical axis of the camera module and hangs on the fixing portion of the optical actuator. Wherein, the two symmetrical side surfaces (such as the first side surface and the second side surface) of the circuit board body can respectively lead out the flexible plates and bend upwards to form two connecting belts, the end of the connecting belt can be provided with the hard plate to form the hanging portion of the circuit board, and the hard plate of the hanging portion can be disposed on the third side surface. A plurality of hard plates can be overlapped each other on the third side surface and achieve electrical connection through the conductive hole-pad structure. The side concaving portion-pin type welding structure in the present application can be disposed on the fourth side surface of the circuit board body, that is, the side surface opposite to the third side surface. This design efficiently and reasonably utilizes the space on the four side surfaces of the circuit board body, thereby making the internal layout of the camera module more compact and contributing to the miniaturization of the camera module.

13. In some embodiments of the present application, a bottom plate (the bottom plate is a part of the outer frame of the camera module) may be provided below the circuit board body, and the bottom plate may be provided with a avoiding through hole located directly below the side concaving portion, so as to prevent the welding medium flowing to the bottom end of the motor pin under the action of gravity from being contacted the bottom plate, thereby avoiding the problem of defective products caused by short circuit.

14. In some embodiments of the present application, the motor pins can be arranged obliquely, thereby reducing the dimension in the height direction occupied by the motor pins, thereby reducing the height of the camera module.

15. In some embodiments of the present application, on the basis of the hanging type circuit board structure, a reinforcing plate is attached to the bottom surface of the circuit board body, and a reinforcing plate bending portion of the edge area of the reinforcing plate is used to hold the flexible plate bending portion of the lateral connecting belt, thereby further reducing the movement resistance force of the circuit board body, further reducing the driving force required for the movement of the photosensitive assembly, and improving the driving precision.

DETAILED DESCRIPTION OF THE EMBODIMENTS

Figure 1:
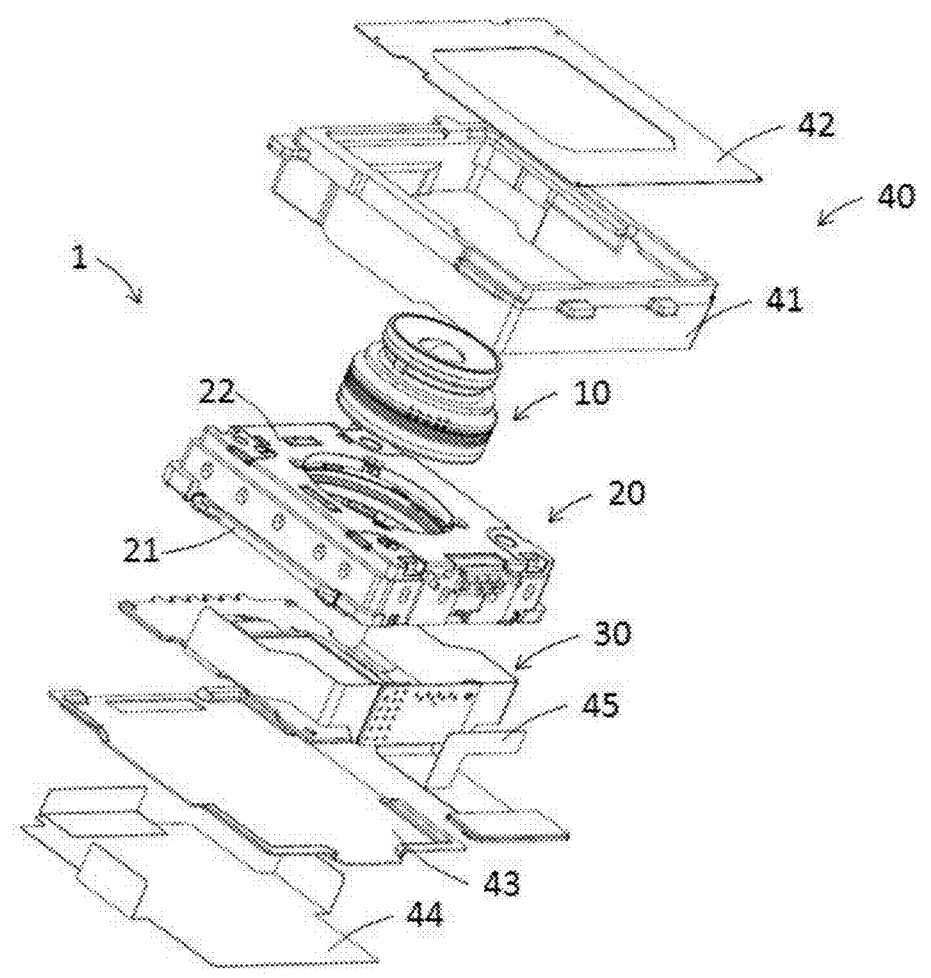
FIG. 1 shows a three-dimensional exploded view of a camera module according to an embodiment of the present application.
Figure 2:
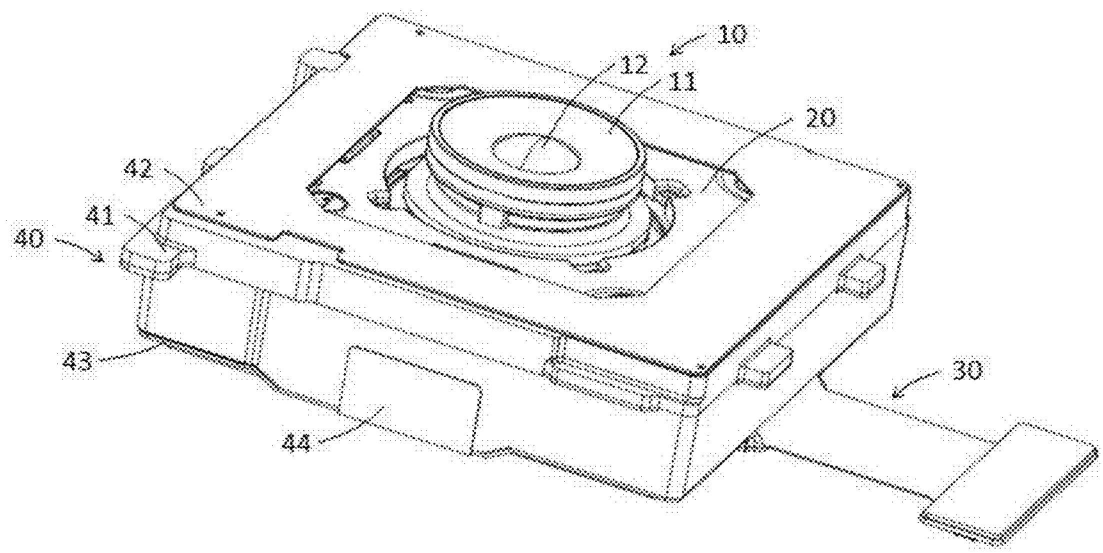
FIG. 2 shows a schematic perspective view of a camera module according to an embodiment of the present application.

For a better understanding of the application, various aspects of the application will be described in more detail with reference to the accompanying drawings. It should be understood that these detailed descriptions are illustration of exemplary examples of the application only, and are not intended to limit the scope of the application in any way. Throughout the specification, the same reference numerals refer to the same elements. The expression “and/or” includes any one and all combinations of one or more of the associated listed items.

It should be noted that in this specification, expressions of a first, a second, etc. are only used to distinguish one feature from another, and do not represent any limitation on the features. Accordingly, a first body discussed hereinafter may also be referred to as a second body without departing from the teachings of the present application.

In the drawings, the thickness, size and shape of objects have been slightly exaggerated for convenience of illustration. The drawings are examples only, and are not strictly drawn to scale.

It should also be understood that the terms “comprise”, “comprising”, “has”, “include” and/or “including”, when used in this specification, means that there are the stated features, integers, steps, operations, elements and/or components, but does not exclude the presence or addition of one or more other features, integers, steps, operations, elements, components and/or combinations thereof. Additionally, when words like the expression “at least one of” appears before a list of listed features, it modifies the entire listed feature instead of modifying the individual elements of the list. In addition, when describing the examples of the present application, the use of “may” means “one or more examples of the present application”. Also, the wording “exemplary” is intended to mean an example or illustration.

As used herein, the terms “substantially”, “about”, and similar terms are used as terms of approximation, not as terms of degree, and are intended to illustrate the inherent bias of a measured value or calculated value that would be recognized by a person skilled in the art.

Unless otherwise defined, all terms (including technical terms and scientific terms) used herein have the same meaning as commonly understood by a person skilled in the art to which this application belongs. It should also be understood that terms (such as those defined in commonly used dictionaries) should be interpreted to have a meaning consistent with their meaning in the context of the relevant art, and will not be interpreted in an idealized or overly formal sense unless it is expressly defined herein.

It should be noted that, in the case of no conflict, the examples in the present application and the features in these examples may be combined with each other.

The present application will be further described below in conjunction with the accompanying drawings and specific examples.

As shown in FIGS. 1-21, a camera module 1 according to an embodiment of the present application is illustrated, which comprises a photosensitive assembly 30, an optical lens 10 held on a photosensitive path of the photosensitive assembly 30, a driving assembly 20 for driving the photosensitive assembly 30 to move, and, an outer frame 40 for packaging. Wherein, the bottom surface of the driving assembly 20 is fixedly connected with the photosensitive assembly 30 to drive the photosensitive assembly 30 to move, the driving assembly 20 has a through hole in the middle, and the through hole of the driving assembly 20 is used to accommodate and fix the optical lens 10, and to provide a light through channel for the optical lens 10 to allow the light refracted by the optical lens 10 to pass through and enter the photosensitive assembly 30. Wherein, the outer frame 40 packages the driving assembly 20 and the photosensitive assembly 30 therein, and provides a fixed position for the driving assembly 20 to fix the driving assembly 20, so that the photosensitive assembly 30 is hung inside the outer frame 40.

The optical lens 10 is held on the photosensitive path of the photosensitive assembly 30 to collect external imaging light. Correspondingly, the optical lens 10 comprises a lens barrel 11 and a lens assembly 12 installed in the lens barrel 11, the lens assembly 12 comprises at least one optical lens element, and the number of the at least one optical lens element is not limited.

The driving assembly 20 comprises a chip driving portion 21, wherein the chip driving portion 21 comprises a chip anti-shake portion 211, and the chip anti-shake portion 211 is adapted to drive the photosensitive assembly 30 to translate in a X-axis direction and a Y-axis direction and/or rotate around a Z-axis direction, in order to achieve the translation anti-shake and/or the rotation anti-shake of the photosensitive assembly 30; or, the chip anti-shake portion 211 is adapted to drive the photosensitive assembly 30 to rotate around the X-axis direction and the Y-axis direction, in order to realize the tilting anti-shake of the photosensitive assembly 30. Wherein, in an embodiment of the present application, the X-axis direction and the Y-axis direction are perpendicular to each other, and the Z-axis direction is perpendicular to the plane where the X-axis direction and the Y-axis direction are located, in other words, the X-axis, the Y-axis and the Z-axis form a three-dimensional coordinate system.

The chip anti-shake portion 211 comprises a chip anti-shake fixing portion 2111, a chip anti-shake movable portion 2112 and a driving element for driving the chip anti-shake movable portion 2112 to move relative to the chip anti-shake fixing portion 2111, and the driving element is connected with the chip anti-shake movable portion 2112 and the chip anti-shake fixing portion 2111 respectively. The chip anti-shake movable portion 2112 is fixed to the photosensitive assembly 30, so that the driving element drives the photosensitive assembly 30 fixed on the chip anti-shake movable portion 2112 to move. Further, the chip anti-shake portion 211 may also comprise a hanging system, wherein the chip anti-shake movable portion 2112 is hung in the chip anti-shake fixing portion 2111 through the hanging system, the hanging system may be implemented as elastic sheets, hanging wires, balls, etc., and the embodiment of the present application is not limited by the type of the hanging system.

In an embodiment of the present application, the chip anti-shake portion 211 may be a driving motor such as a voice coil motor, a piezoelectric motor, an SMA (Shape Memory Alloy) motor, or the like.

When the chip anti-shake portion 211 is implemented as a voice coil motor, the driving element is implemented as a coil-magnet pair, that is, the driving force for driving the chip anti-shake movable portion 2112 to move is generated by the electromagnetic interaction between the coil and the magnet. The coil and the magnet of the coil-magnet pair are adapted to be disposed on the chip anti-shake movable portion 2112 and the chip anti-shake fixing portion 2111 respectively. That is, it may be that the coil of the coil-magnet pair is fixedly disposed on the chip anti-shake movable portion 2112, and the magnet of the coil-magnet pair is fixedly disposed on the chip anti-shake fixing portion 2111, in this way, it can reduce the driving force demand for the driving element; it can also be that the magnet of the coil-magnet pair is fixedly disposed on the chip anti-shake movable portion 2112 and the coil of the coil-magnet pair is fixedly disposed on the chip anti-shake fixing portion 2111, in this way, the way of energizing the coil can be simplified. The number of the coil-magnet pair can be one or more, and it is disposed around the chip anti-shake movable portion 2112. Preferably, the number of the coil-magnet pair can be two, three or four, and they are located on adjacent side surfaces of the chip anti-shake movable portion 2112.

When the chip anti-shake portion 211 is implemented as an SMA motor, the driving element is implemented as an SMA (Shape Memory Alloy) wire, wherein the shape memory alloy is an alloy material that can completely eliminate the deformation that occurs at lower temperatures by being heated and restore its original shape before deformation. For example, when the shape memory alloy undergoes a limited plastic deformation at a temperature lower than the phase transition temperature, it can be restored to its original shape before deformation by being heated, wherein, the SMA wire can be heated by energizing the SMA wire.

Figure 3:
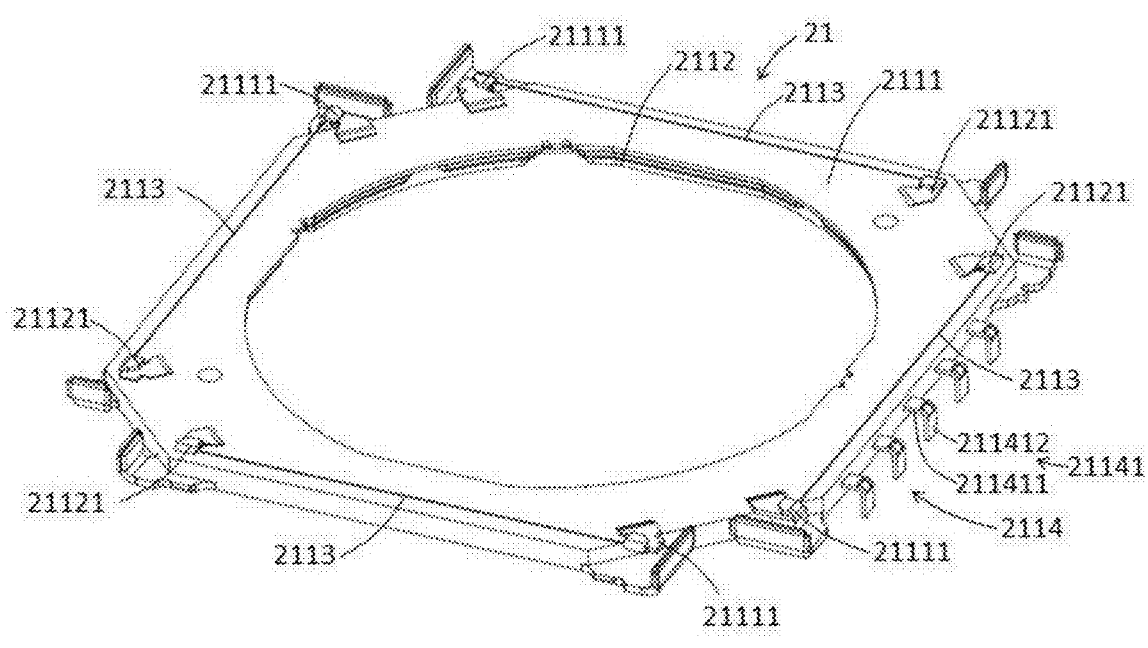
FIG. 3 shows a schematic perspective view of a chip driving portion of an optical actuator according to an embodiment of the present application.

As shown in FIG. 3, in an embodiment of the present application, the four sides of the chip anti-shake portion 211 are respectively provided with a set of SMA wires 2113, and each set of SMA wires 2113 comprises at least one SMA wire, wherein the adjacent two sides of the four sides of the chip anti-shake portion 211 are arranged vertically (approximately vertically), and the opposite two sides of the four sides of the chip anti-shake portion 211 are arranged parallel (approximately parallel). Specifically, on each of the four sides of the chip anti-shake portion 211, the chip anti-shake fixing portion 2111 has a first fixing end 21111 respectively, and the chip anti-shake movable portion 2112 has a second fixing end 21121, wherein the two ends of the set of SMA wires 2113 are respectively fixed to the chip anti-shake fixing portion 2111 through the first fixing end 21111 and fixed to the chip anti-shake movable portion 2112 through the second fixing end 21121, so that the set of SMA wires 2113 drives the chip anti-shake movable portion 2112 to move relative to the chip anti-shake fixing portion 2111, so that the four sets of SMA wires 2113 located on the four sides of the chip anti-shake portion 211 drive the chip anti-shake movable portion 2112 to translate in the perpendicular X-axis and Y-axis directions relative to the chip anti-shake fixing portion 2111, or can also drive the chip anti-shake movable portion 2112 to rotate around the Z-axis perpendicular to the plane where the X-axis and the Y-axis are located relative to the chip anti-shake fixing portion 2111, so that the chip anti-shake portion 211 can drive the photosensitive assembly 30 fixedly connected to the chip anti-shake movable portion 2112 to translate in the X, Y-axis direction and/or rotate around the Z-axis direction. Further, the first fixing end 21111 and the second fixing end 21121 can also have a conductive function, so as to provide current to the SMA wires 2113, make the SMA wires be heated, and make the SMA wires deform.

The chip anti-shake portion 211 further comprises a chip anti-shake electrical connecting portion 2114, and the chip electrical connecting point is electrically connected with the driving element, that is, the SMA wires 2113, thereby providing the driving power supply for the chip anti-shake portion 211 through the chip anti-shake electrical connecting portion 2114. The chip anti-shake electrical connecting portion 2114 is located on one side of the chip anti-shake portion 211, and it further comprises a plurality of pins 21141, for example, the chip anti-shake electrical connecting portion 2114 comprises five pins 21141 located on one side of the chip anti-shake portion 211, and the pins 21141 are spaced apart from each other and fixed in an inverted "L" shape on one side of the chip anti-shake fixing portion 2111 of the chip anti-shake portion 211.

The driving assembly 20 further comprises a lens driving portion 22, and the lens driving portion 22 is adapted to drive the optical lens 10 to move. The lens driving portion 22 comprises a lens focusing portion 221, and the lens focusing portion 221 is adapted to drive the optical lens 10 to translate in the Z-axis direction, so as to adjust the distance between the optical lens 10 and the photosensitive assembly 30 to realize the focusing function of the optical lens 10. Further, the lens driving portion 22 may also comprise a lens anti-shake portion 222, and the lens anti-shake portion 222 is adapted to drive the optical lens 10 to translate in the X-axis direction and the Y-axis direction and/or rotate around the Z-axis direction, in order to achieve the translation anti-shake and/or the rotation anti-shake of the optical lens 10; or, the lens anti-shake portion 222 is adapted to drive the optical lens 10 to rotate around the X-axis direction and the Y-axis direction, in order to realize the tilting anti-shake of the optical lens 10. It should be pointed out that the lens driving portion 22 may only comprise the lens focusing portion 221 or the lens anti-shake portion 222; the lens driving portion 22 may also comprise the lens focusing portion 221 and the lens anti-shake portion 222 at the same time, so that the lens driving portion 22 can not only realize the lens focusing function but also realize the lens anti-shake function.

In an embodiment of the present application, the lens focusing portion 221 and the lens anti-shake portion 222 may be driving motors such as voice coil motors, piezoelectric motors, SMA (Shape Memory Alloy) motors, or the like.

Figure 4:
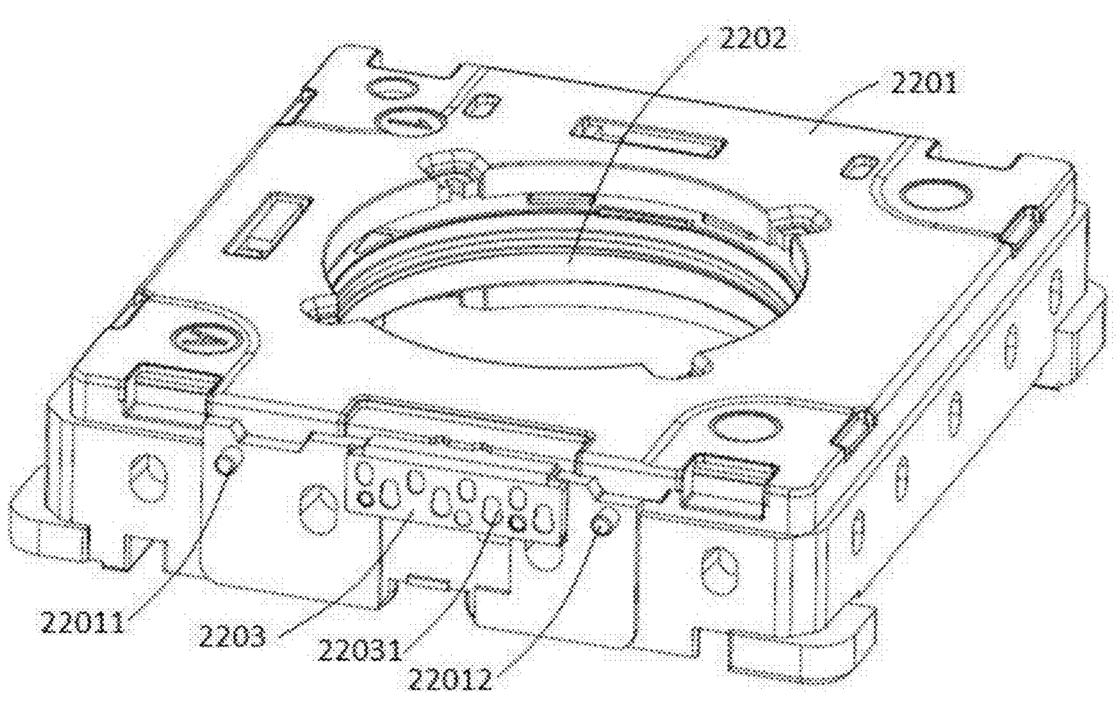
FIG. 4 shows a schematic perspective view of a lens driving portion of an optical actuator according to an embodiment of the present application.

As shown in FIG. 4, in an embodiment of the present application, the lens driving portion 22 comprises a lens driving fixing portion 2201, a lens driving movable portion 2202 and a driving element (not shown) for driving the lens driving movable portion 2202 to move relative to the lens driving fixing portion 2201, and the driving element is connected with the lens driving movable portion 2202 and the lens driving fixing portion 2201 respectively. The lens driving movable portion 2202 is fixed to the optical lens 10, so that the driving element drives the optical lens 10 fixed on the lens driving movable portion 2202 to move. Further, the lens driving portion 22 may also comprise a hanging system (not shown), wherein the lens driving movable portion 2202 is hung in the lens driving fixing portion 2201 through the hanging system, the hanging system may be implemented as one or more of elastic sheets, hanging wires, balls, etc., and the present application is not limited by the type of the hanging system.

In an embodiment of the present application, the driving element drives the lens driving movable portion 2202 to move relative to the lens driving fixing portion 2201, which is adapted to realize lens focusing or lens anti-shake function, so that the driving element, the lens driving movable portion 2202 and the lens driving fixing portion 2201 constitute the lens focusing portion 221 or the lens anti-shake portion 222. Alternatively, the lens driving movable portion 2202 may further comprise a first lens driving movable portion 2202, a second lens driving movable portion 2202 located on the inner side of the first lens driving movable portion 2202, and a driving element for driving the second lens driving movable portion 2202 to move relative to the first lens driving movable portion 2202. Therefore, the driving element located between the lens driving fixing portion 2201 and the lens driving movable portion 2202 drives the lens driving movable portion 2202 to move to realize the lens anti-shake function, and the driving element located between the first lens driving movable portion 2202 and the second lens driving movable portion 2202 drives the second lens driving movable portion 2202 to move to realize the lens focusing function; alternatively, the driving element located between the lens driving fixing portion 2201 and the lens driving movable portion 2202 drives the lens driving movable portion 2202 to move to realize the lens focusing function, and the driving element located between the first lens driving movable portion 2202 and the second lens driving movable portion 2202 drives the second lens driving movable portion 2202 to move to realize the lens anti-shake function.

The lens driving portion 22 comprises a lens driving electrical connecting portion 2203 located on the side surface, and the lens driving electrical connecting portion 2203 is electrically connected with the driving element of the lens driving portion 22 and provides the driving power supply for the lens driving portion 22. The lens driving electrical connecting portion 2203 comprises a plurality of lens driving pads 22031, and the plurality of lens driving pads 22031 are arranged in two rows to reduce the length of the lens driving electrical connecting portion 2203, for example, the number of the lens driving pads 22031 located in the upper row is four, and the number of the lens driving pads 22031 located in the lower row is also four.

The lens driving fixing portion 2201 of the lens driving portion 22 further comprises at least two hanging portions, and the at least two hanging portions are located on the side surface of the lens driving fixing portion 2201. In an embodiment of the present application, the at least two hanging portions and the lens driving electrical connecting portion 2203 are located on the same side of the lens driving fixing portion 2201. The number of the at least two hanging portions can be two, which are the first hanging portion 22011 and the second hanging portion 22012 respectively, and the first hanging portion 22011 and the second hanging portion 22012 are respectively located on both sides of the lens driving electrical connecting portion 2203 and extend outward from the lens driving fixing portion 2201. The functions of the at least two hanging portions will be elaborated in the subsequent description of the photosensitive assembly 30, and will not be further elaborated here.

In the present application, the lens driving portion 22 and the chip driving portion 21 may be separated from each other, or may be fixed to each other, and the lens driving portion 22 may be fixed to the chip driving portion 21 by the adhesive fixation or the integrated molding structure between the lens driving fixing portion 2201 and the chip driving fixing portion (for example, the chip anti-shake fixing portion 2111) of the chip driving portion 21.

Figure 5:
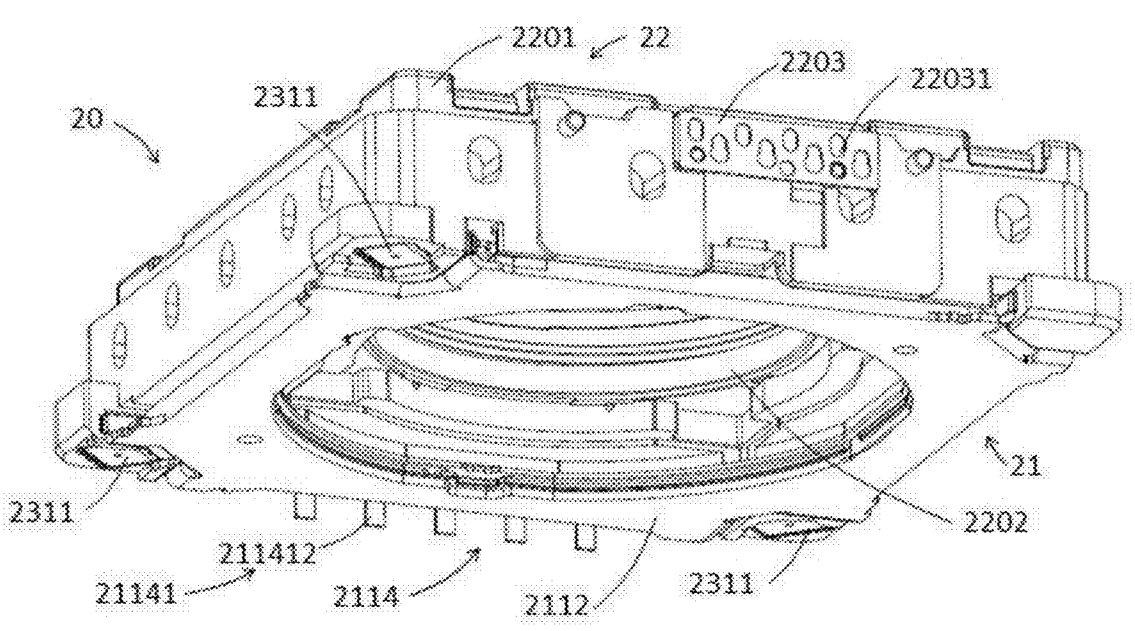
FIG. 5 shows a schematic perspective view of an optical actuator according to an embodiment of the present application.
Figure 6:
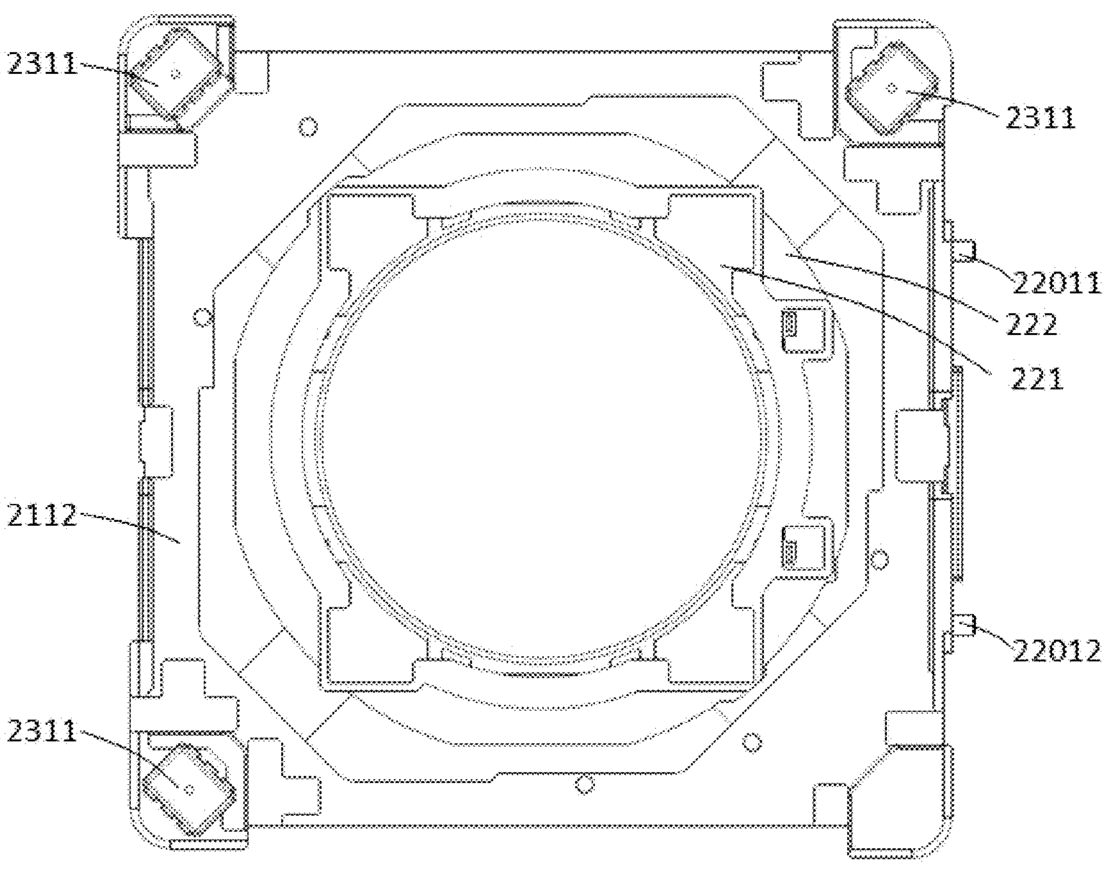
FIG. 6 shows a schematic upward view of an optical actuator according to an embodiment of the present application.

FIGS. 5-6 show that the driving assembly 20 in the present application may comprise the lens driving portion 22 and the chip driving portion 21. The four corner areas of the chip driving portion 21 are concave inward to form four concaving portions, so that the four corner areas of the lens driving portion 22 protrude downwards to form four protruding portions extending into the four concave portions of the chip driving portion 21, wherein, a sensing magnet 2311 is respectively fixed in each of the three concaving portions of the four concaving portions of the lens driving portion 22, that is, three sensing magnets 2311 are fixed in the four corner areas of the lens driving portion 22, and the sensing magnets 2311 are used to provide a magnetic field for a position sensor 2312 on the photosensitive assembly 30 shown in FIG. 7, thereby detecting the displacement of the photosensitive assembly 30, wherein the position sensor 2312 is adapted to determine the direction and distance of movement by sensing changes in the magnetic field. In other implementations of the present application, the number of the sensing magnets 2311 may also be one, two or four or other numbers.

FIG. 5 further shows that the chip anti-shake electrical connecting portion 2114 of the chip driving portion 21 and the lens driving electrical connecting portion 2203 of the lens driving portion 22 are respectively located on opposite sides of the driving assembly 20. FIG. 6 further shows that the lens focusing portion 221 of the lens driving portion 22 is located on the inner side of the lens anti-shake portion 222, and the size of the through hole in the middle of the chip driving portion 21 is larger than the size of the through hole in the middle of the lens driving portion 22, thereby providing an unobstructed light path for the optical lens 10, so as to reduce the occurrence of vignetting.

As shown in FIGS. 7-12, in an embodiment of the present application, the photosensitive assembly 30 comprises a circuit board 31, a photosensitive chip 32, a base 34 and a filter element 35.

The photosensitive chip 32 comprises a photosensitive area 321 and a non-photosensitive area 322321, and the photosensitive chip 32 is electrically connected to the circuit board 31 through the photosensitive chip pad located at the non-photosensitive area 322321. For example, the photosensitive chip 32 can be electrically connected to the circuit board 31 by means of gold wire bonding, leading wire bonding, welding, FC process (flip chip), RDL (redistribution layer technology) and the like. The photosensitive chip 32 is adapted to be fixed on an upper surface (the side of the circuit board 31 facing the lens is defined as the upper surface) of the circuit board 31 through an adhesive medium, or the photosensitive chip 32 is disposed in a circuit board through hole 3111 of the circuit board 31, thereby reducing the influence of the thickness of the circuit board 31 on the thickness of the photosensitive assembly 30, so as to reduce the height of the camera module.

The base 34 is disposed on the chip photosensitive portion of the circuit board 31 for supporting other components. In a specific example of the present application, the base 34 is implemented as a plastic bracket molded separately, which is attached to the surface of the circuit board 31 through an adhesive medium and used to support other components. Of course, in other examples of the present application, the base 34 can also be formed on the circuit board 31 in other ways, for example, the base 34 is implemented as a molded base, which is integrally formed on the predetermined position of the circuit board 31 through the molding process, and this is not limited by the present application.

In an embodiment of the present application, the filter element 35 is held on the photosensitive path of the photosensitive chip 32 for filtering the imaging light entering the photosensitive chip 32. In a specific example, the filter element 35 is installed on the base 34 and at least corresponds to the photosensitive area 321 of the photosensitive chip 32. It is worth mentioning that, in other examples of the present application, the filter element 35 may be indirectly installed on the base 34 through other support members. Moreover, in other examples of the present application, the filter element 35 can also be installed in other positions of the camera module 1, for example, the filter element 35 is formed inside the optical lens 10 (for example, as a layer of filter film attached to the surface of a piece of optical lens element of the optical lens 10), which is not limited by the present application.

The circuit board 31 comprises a circuit board body 311, connecting belts and a connector portion 314. Wherein, the circuit board body 311 is used to install and electrically connect the photosensitive chip 32 and electronic elements 33, the electronic elements 33 comprise passive devices such as capacitors and resistors and active devices such as driving chips, the connecting belts electrically connect and fix the circuit board body 311 and the connector portion 314, and the connector portion 314 is used for electrically connecting with mobile electronic devices to export image information output by the photosensitive chip 32.

The four corner areas of the circuit board body 311 of the circuit board 31 are also fixed and electrically connected with position sensors 2312 for sensing the movement of the photosensitive assembly 30, and the number and position of the position sensors 2312 correspond to the sensing magnets 2311 located on the driving assembly 20. For example, when the three corner areas of the four corner areas of the driving assembly 20 are respectively provided with one sensing magnet 2311, the positions of the photosensitive chip 32 of the circuit board 31 corresponding to the three corner areas of the four corner areas of the driving assembly 20 are respectively fixed and electrically connected with one position sensor 2312.

Figure 7:
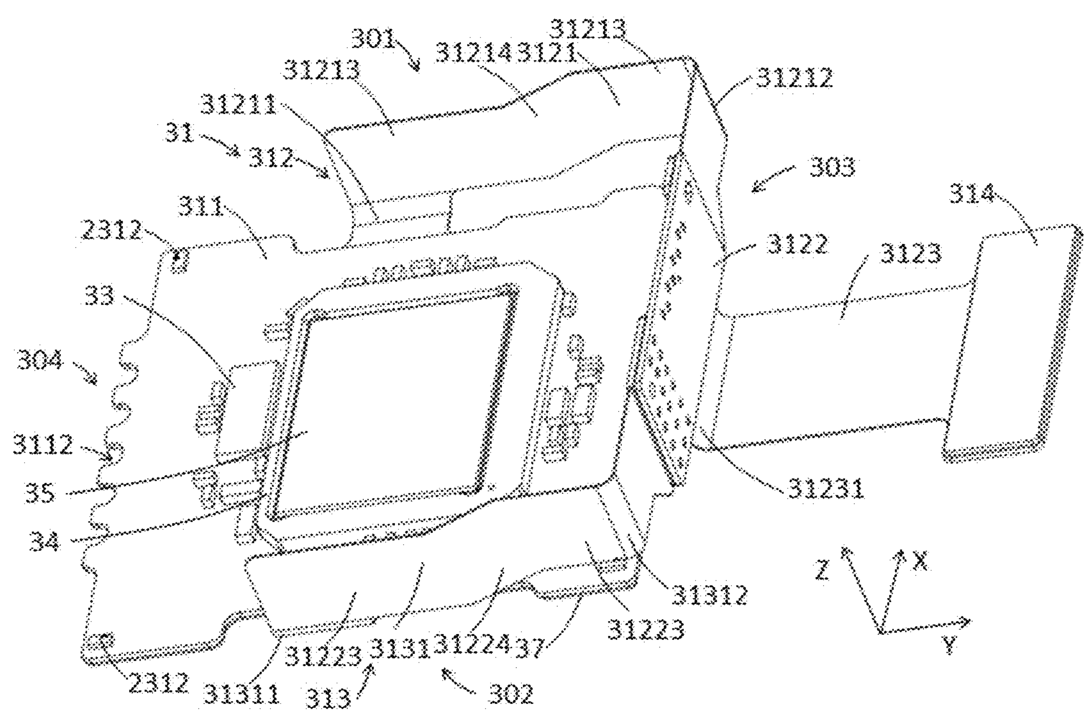
FIG. 7 shows a schematic perspective view of a hanging type circuit board and a photosensitive chip mounted thereon according to an embodiment of the present application.
Figure 8:
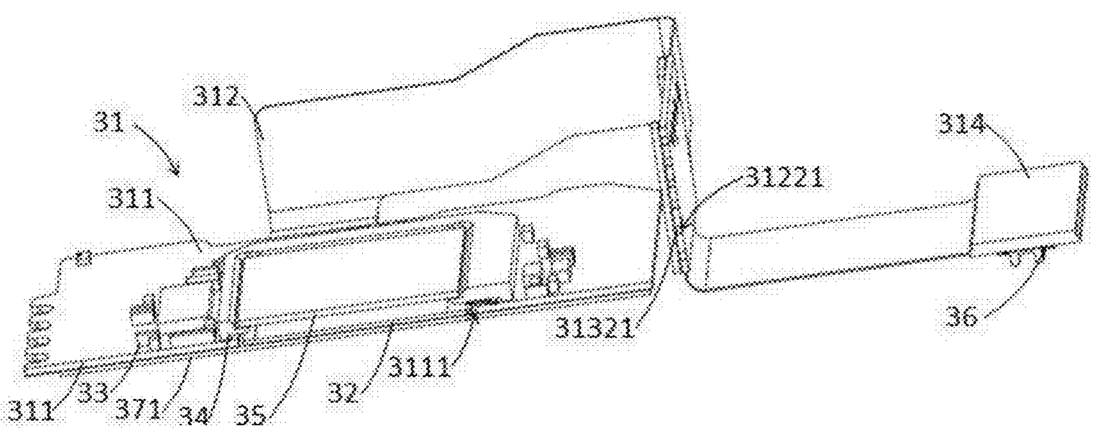
FIG. 8 shows a three-dimensional cross-sectional view of a hanging type circuit board and a photosensitive chip mounted thereon according to an embodiment of the present application.

As shown in FIGS. 7-8, in a specific example of the present application, the base 34 is fixed to the circuit board body 311 of the circuit board 31 through an adhesive medium and packages the photosensitive chip 32 therein, and the photosensitive chip 32 is located on the inner side of the base 34 (referring to the side facing the photosensitive chip 32), and the electronic elements 33 are located on the outer side of the base 34. In other words, the base 34 only packages the photosensitive chip 32. Of course, in other examples of the present application, the base 34 can also package the photosensitive chip 32 and part of the electronic elements 33 therein, and the other part of the electronic elements 33 are located on the outer side of the base 34; or, the base 34 can also package the photosensitive chip 32 and all the electronic elements 33 therein. When the base 34 only packages the photosensitive chip 32 therein, the base 34 can prevent the dust that may exist on the electronic elements 33 from polluting the photosensitive chip 32.

Figure 9:
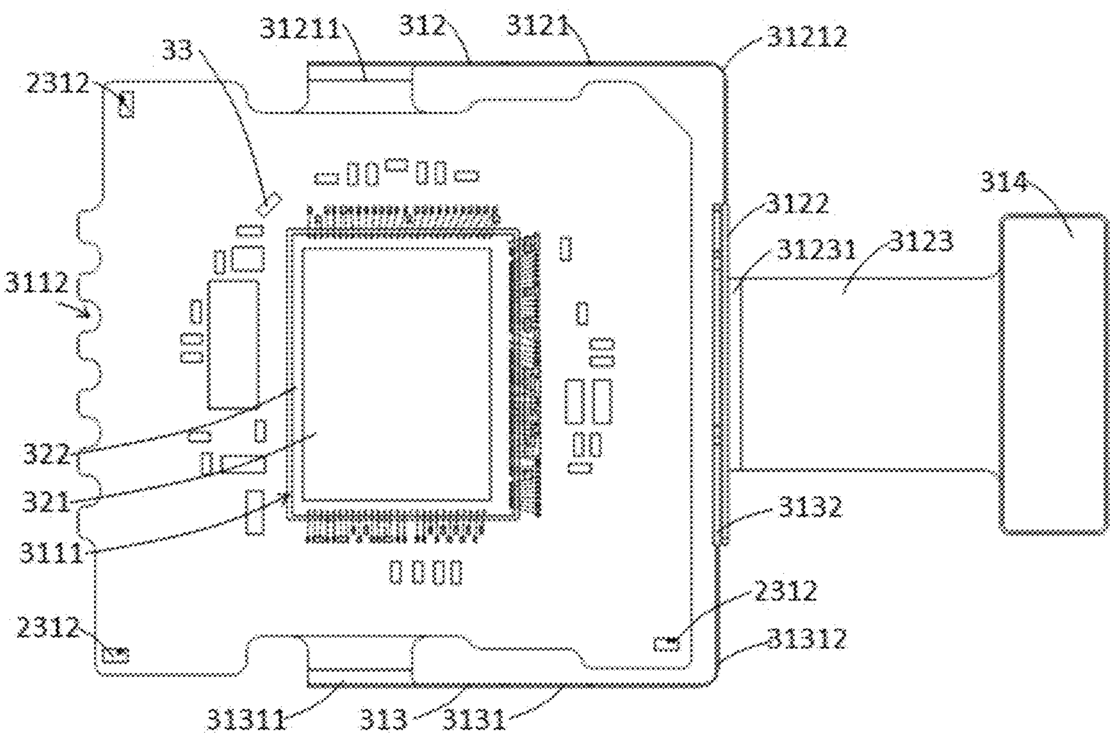
FIG. 9 shows a schematic top view of a hanging type circuit board and a photosensitive chip mounted thereon according to an embodiment of the present application.

Further, as shown in FIGS. 7-9, the number of the electronic elements 33 is multiple, and arranged around the photosensitive chip 32 and the base 34, and a plurality of the electronic elements 33 are arranged in a circular area, which is related to the shape of the chip anti-shake movable portion 2112 of the chip anti-shake portion 211. The chip anti-shake movable portion 2112 has a cylindrical through hole, wherein when the chip anti-shake movable portion 2112 is fixed on the circuit board body 311, there is less space reserved on the circuit board 31, therefore, the base 34 is only used to package the photosensitive chip 32, and the plurality of electronic elements 33 are arranged around the base 34, and further the electronic elements 33 can be arranged in a circular area. Through the above design, the base 34 does not need to package the electronic elements 33, so that the dimensions of the base in the length direction, width direction, and height direction are reduced, the cylindrical through hole of the chip anti-shake movable portion 2112 does not need to be further enlarged due to the size of the base 34 designed in a rectangular shape, and a plurality of the electronic elements 33 can be arranged on the base 34 and the cylindrical through hole of the chip anti-shake movable portion 2112, thereby reducing the horizontal size of the camera module. The upper surface of the circuit board body 311 can further be provided with dust-catching glue to capture dirt such as dust in the camera module. For example, the dust-catching glue can be disposed on the peripheral side of the circular area in a ring shape or covers multiple electronic elements 33.

Further, the circuit board body 311 has a circuit board through hole 3111 in the middle, preferably, the circuit board through hole 3111 is similar in shape to the photosensitive chip 32, for example, the circuit board through hole 3111 is disposed in a rectangular shape to accommodate the photosensitive chip 32, so as to reduce the height of the photosensitive assembly 30.

Further, the photosensitive assembly 30 further comprises a reinforcing plate 37, and the reinforcing plate 37 is fixed on the back surface (referring to the side of the circuit board 31 away from the lens, opposite to the upper surface of the circuit board body) of the circuit board body 311 of the circuit board 31 through an adhesive medium, to provide support and reinforcement for the circuit board body 311. The reinforcing plate 37 can be a metal plate such as a steel plate or a copper plate, or a plastic plate, which is not limited by the present application. In a specific example of the present application, the circuit board body 311 has a circuit board through hole 3111, wherein the reinforcing plate 37 is fixed on the back surface of the circuit board body 311, and the reinforcing plate 37 and the circuit board body 311 form a groove, and the photosensitive chip 32 is fixed on the reinforcing plate 37 through an adhesive medium and accommodated in the circuit board through hole 3111 of the circuit board body 311, and the thickness of the reinforcing plate 37 can be thinner than the circuit board body 311 to reduce the height of the photosensitive assembly 30, and the reinforcing plate 37 can provide a smoother surface for bonding and fixing for the photosensitive chip 32 than the circuit board body 311.

The circuit board body 311 can be a hard plate or a flexible plate, and the connecting belts electrically connected with the photosensitive chip 32 are combination plates with flexible plates and hard plates. Specifically, the connecting belts comprise a first connecting belt 312 and a second connecting belt 313, wherein the first connecting belt 312 and the second connecting belt 313 are led out from two opposite side surfaces (for ease of description, the two opposite side surfaces may be referred to as a first side surface 301 and a second side surface 302, adjacent to the first side surface 301 and the second side surface 302 are a third side surface 303 and a fourth side surface 304, the third side surface 303 and the fourth side surface 304 are arranged opposite to each other, and the first side surface 301, the third side surface 303, the second side surface 302 and the fourth side surface 304 are arranged in a clockwise direction) of the circuit board body 311 respectively and bend upwards (referring to the direction away from the circuit board body 311), and, the first connecting belt 312 further is extended along the first side surface 301 toward the third side surface 303 and is bent toward the third side surface 303, and the second connecting belt 313 further is extended along the second side surface 302 toward the third side surface 303 and is bent toward the third side surface 303, so that the first connecting belt 312 and the second connecting belt 313 are fixed on the third side surface 303 to form a complete connecting belt, and the connecting belt is arranged around three side surfaces that are the first side surface 301, the second side surface 302, and the third side surface 303 of the circuit board body 311. Further, the first connecting belt 312 is electrically connected with the second connecting belt 313 on the third side surface 303, and the first connecting belt 312 is bent away from the circuit body 311 in the bottom portion of the third side surface 303 and is extended away from the circuit board body 311, and is electrically connected with the connector portion 314. Through the structure and arrangement of the above mentioned connecting belts, when the driving assembly 20 drives the circuit board body 311 to move, the resistance force produced by the connecting belts is relatively small, which solves the problem of significant resistance caused by the deviation of the connecting belts relative to the circuit board body 311 in the same plane in the prior art.

The connector portion 314 can be a hard plate or a flexible plate, and a connector 36 is electrically connected to the upper surface or the back surface of the connector portion 314. Through the connector 36, the camera module 1 is electrically connected with the mobile electronic device to export image information output by the photosensitive chip 32. In an example of the present application, the connector portion 314 can further be electrically connected with other electronic elements, so as to reduce the number of the electronic elements 33 electrically connected to the circuit board body 311.

Specifically, the first connecting belt 312 comprises a first connecting belt flexible plate 3121, a first connecting belt hard plate 3122 and a third connecting belt flexible plate 3123, and the first connecting belt flexible plate 3121 is respectively electrically connected with the circuit board body 311 and the first connecting belt hard plate 3122, and the third connecting belt flexible plate 3123 is respectively electrically connected with the first connecting belt hard plate 3122 and the connector portion 314. The first connecting belt flexible plate 3121 is provided with a first bending portion 31211 and a second bending portion 31212, and the first connecting belt flexible plate 3121 is connected with the circuit board body 311 through the first bending portion 31211 and is bent upward from the first side surface 301 of the circuit board body 311, and is bent from the first side surface 301 to the third side surface 303 through the second bending portion 31212, so that the first connecting belt flexible plate 3121 is connected with the first connecting belt hard plate 3122 located on the third side surface 303. The third connecting belt flexible plate 3123 comprises a third bending portion 31231, and the third connecting belt flexible plate 3123 is connected to the lower portion of the first connecting belt hard plate 3122 through the third bending portion 31231 and is bent from the lower portion of the first connecting belt 3122 away from the circuit board body 311, so that the third connecting belt flexible plate 3123 is connected with the connector portion 314.

That is, the first bending portion 31211 is located close to the intersection of the first side surface 301 and the bottom surface of the circuit board body 311, the second bending portion 31212 is located close to the intersection of the first side surface 301 and the third side surface 303, and the third bending portion 31231 is located close to the intersection of the third side surface 303 and the bottom surface of the circuit board body 311.

The second connecting belt 313 comprises a second connecting belt flexible plate 3131 and a second connecting belt hard plate 3132, and the second connecting belt flexible plate 3131 is respectively electrically connected with the circuit board body 311 and the second connecting belt hard plate 3132. The second connecting belt flexible plate 3131 is provided with a fourth bending portion 31311 and a fifth bending portion 31312, and the second connecting belt flexible plate 3131 is connected with the circuit board body 311 through the fourth bending portion 31311 and is bent upward from the second side surface 302 of the circuit board body 311, and is bent from the first side surface 301 to the third side surface 303 through the fifth bending portion 31312, so that the second connecting belt flexible plate 3131 is connected with the second connecting belt hard plate 3132 located on the third side surface 303.

That is, the fourth bending portion 31311 is located close to the intersection of the second side surface 302 and the bottom surface of the circuit board body 311, and the fifth bending portion 31312 is located close to the intersection of the second side surface 302 and the third side surface 303.

The direction perpendicular to the first side surface 301 or the second side surface 302 is defined as the X-axis direction, the direction perpendicular to the third side surface 303 and the fourth side surface 304 is defined as the Y-axis direction, the X-axis direction is perpendicular to the Y-axis direction, and the direction perpendicular to the plane where the X-axis direction and the Y-axis direction are located (i.e. the plane where the circuit board body 311 is located) is defined as the Z-axis direction. The first bending portion 31211 and the fourth bending portion 31311 are adapted to bend along the Y-axis direction, so as to reduce the resistance force of the connecting belts when the circuit board body 311 is driven by the driving assembly 20 to move in the X-axis direction; the second bending portion 31212 and the fifth bending portion 31312 are adapted to bend along the Z-axis direction, so as to reduce the resistance force of the connecting belts when the circuit board body 311 is driven by the driving assembly 20 to move in the Y-axis direction. The first bending portion 31211, the fourth bending portion 31311, the second bending portion 31212 and the fifth bending portion 31312 are further adapted to reduce the resistance force of the connecting belts (comprising the first connecting belt 312 and the second connecting belt 313) when the circuit board body 311 is driven by the driving assembly 20 to move in the X-axis direction, the Y-axis direction or the Z-axis direction.

The first connecting belt flexible plate 3121 further comprises two first horizontal portions 31213 and a first inclined portion 31214 between the first bending portion 31211 and the second bending portion 31212. The first inclined portion 31214 is connected with the two first horizontal portions 31213, and through the first inclined portion 31214, the first connecting belt flexible plate 3121 is extended from the first bending portion 31211 to the second bending portion 31212 and is extended upwards, wherein a height difference is provided between the two first horizontal portions 31213; and/or, through the first inclined portion 31214, the first connecting belt flexible plate 3121 is extended from the first bending portion 31211 to the second bending portion 31212 and is extended outwards (away from the circuit board body), wherein a gap is provided between the planes where the two first horizontal portions 31213 are located, and the planes where the two first horizontal portions 31213 are located are parallel to or intersect each other. Through the above structure, an avoidance space is provided to avoid the driving assembly 20 or the outer frame 40 to avoid mutual interference, at the same time, which facilitates reducing the resistance force when the driving assembly 20 drives the circuit board body 311 to move.

The second connecting belt flexible plate 3131 further comprises two second horizontal portions 31223 and a second inclined portion 31224 between the fourth bending portion 31311 and the fifth bending portion 31312. The second inclined portion 31224 is connected with the two second horizontal portions 31223, and through the second inclined portion 31224, the second connecting belt flexible plate 3131 is extended from the fourth bending portion 31311 to the fifth bending portion 31312 and is extended upwards, wherein a height difference is provided between the two second horizontal portions 31223; and/or, through the second inclined portion 31224, the second connecting belt flexible plate 3131 is extended from the fourth bending portion 31311 to the fifth bending portion 31312 and is extended outwards (away from the circuit board body), wherein a gap is provided between the planes where the two second horizontal portions 31223 are located, and the planes where the two second horizontal portions 31223 are located are parallel to or intersect each other. Through the above structure, an avoidance space is provided to avoid the driving assembly 20 or the outer frame 40 to avoid mutual interference, at the same time, which facilitates reducing the resistance force when the driving assembly 20 drives the circuit board body 311 to move.

Further, in an embodiment of the present application, a shaping layer is attached to the inner and/or outer side of the first bending portion 31211 and the fourth bending portion 31311, so that the first connecting belt 312 is kept bent at the first bending portion 31211 and the second connecting belt 313 is kept bent at the fourth bending portion 31311; a shaping layer is attached to the inner and/or outer side of the second bending portion 31212 and the fifth bending portion 31312, so that the first connecting belt 312 is kept bent at the second bending portion 31212 and the second connecting belt 313 is kept bent at the fifth bending portion 31312. The shaping layer may be copper foil or other thinner components with a shaping effect.

Figure 10:
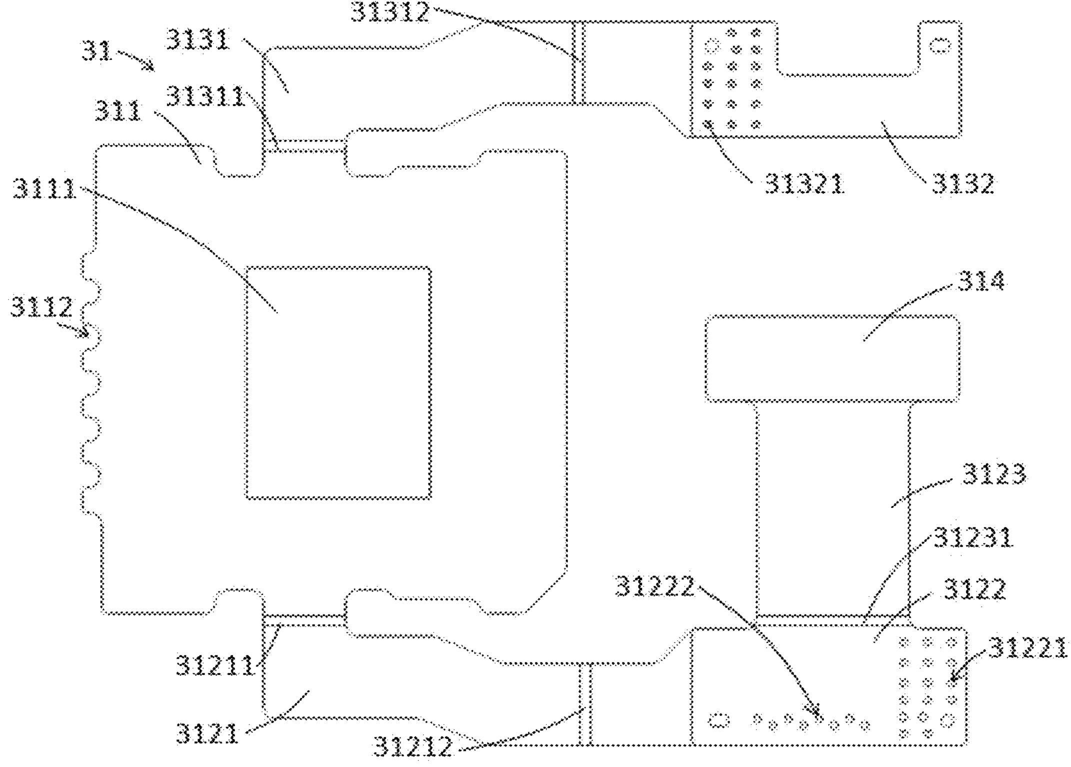
FIG. 10 shows a schematic top view of a hanging type circuit board in a flattened state according to an embodiment of the present application.

Further, FIG. 10 shows the bottom surface of the circuit board 31 in a flattened state in an embodiment of the present application, and the circuit board 31 comprises a circuit board body 311, a first connecting belt 312, a second connecting belt 313 and a connector portion 314. The circuit board body 311 is provided with a rectangular circuit board through hole 3111 for accommodating the photosensitive chip 32, the first side surface 301 of the circuit board body 311 is electrically connected with the first connecting belt 312, and the second side surface 302 of the circuit board body 311 is electrically connected with the second connecting belt 313.

The first connecting belt 312 comprises the first connecting belt flexible plate 3121, the first connecting belt hard plate 3122 and the third connecting belt flexible plate 3123, the first connecting belt flexible plate 3121 comprises a first bending portion 31211 and a second bending portion 31212, the first connecting belt flexible plate 3121 is connected with the circuit board body 311 through the first bending portion 31211 and connected with the first connecting belt hard plate 3122 through the second bending portion 31212, and the first connecting belt flexible plate 3121 is adapted to be bent by bending the first bending portion 31211 and the second bending portion 31212; the third connecting belt flexible plate 3123 comprises a third bending portion 31231, the third connecting belt flexible plate 3123 is connected with the first connecting belt hard plate 3122 through the third bending portion 31231, and the third connecting belt flexible plate 3123 is adapted to be bent by bending the third bending portion 31231.

The second connecting belt 313 comprises the second connecting belt flexible plate 3131 and the second connecting belt hard plate 3132, and the second connecting belt flexible plate 3131 comprises a fourth bending portion 31311 and a fifth bending portion 31312. The second connecting belt flexible plate 3131 is connected to the circuit board body 311 through the fourth bending portion 31311, and the second connecting belt flexible plate 3131 and the first connecting belt flexible plate 3121 are arranged on the opposite sides of the circuit board body 311; the second connecting belt flexible plate 3131 is connected with the second connecting belt hard plate 3132 through the fifth bending portion 31312. The second connecting belt flexible plate 3131 is adapted to be bent by bending the fourth bending portion 31311 and the fifth bending portion 31312.

Figure 11:
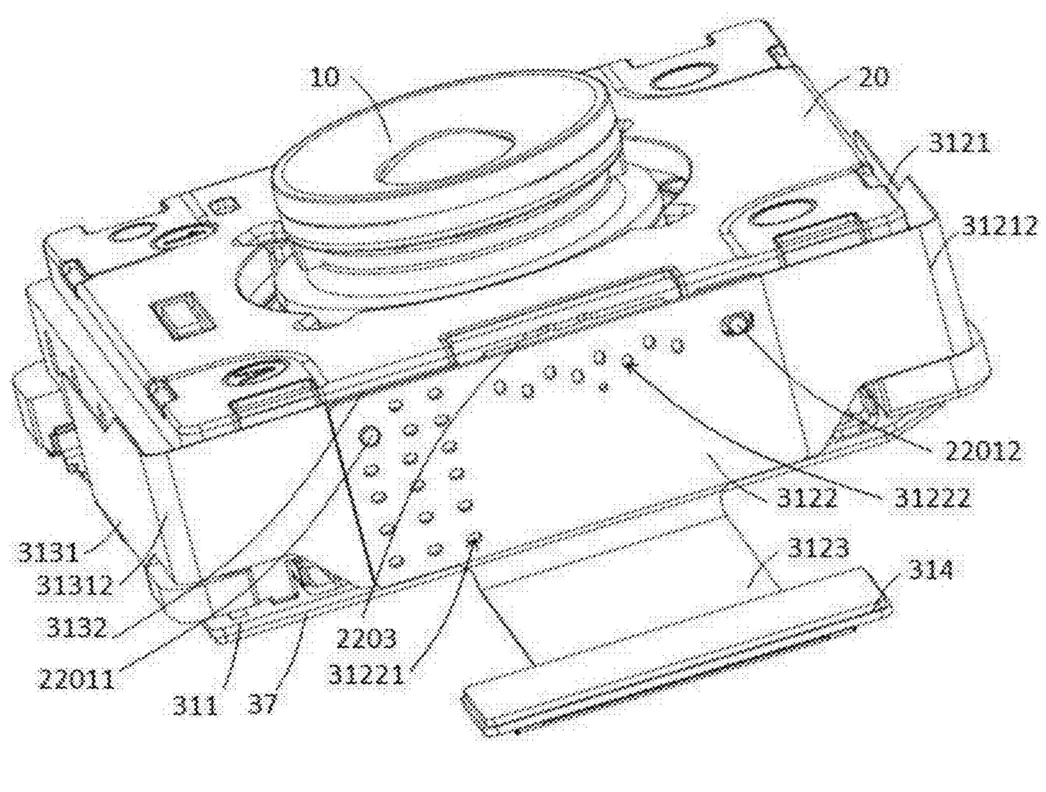
FIG. 11 shows a perspective view of the camera module according to an embodiment of the present application after removing the outer frame; in this figure, the positional relationship between the hanging type circuit board and the optical actuator inside the outer frame is revealed.

By bending the first connecting belt flexible plate 3121 and the second connecting belt flexible plate 3131, the first connecting belt hard plate 3122 and the second connecting belt hard plate 3132 are fixed and electrically connected to each other on the third side surface 303 of the circuit board body 311. FIG. 11 shows the structure of the first connecting belt flexible plate 3121 and the second connecting belt flexible plate 3131 being bent of the circuit board 31. Wherein, the first connecting belt hard plate 3122 is located on the outer side, that is, the second connecting belt hard plate 3132 is located between the driving assembly 20 and the first connecting belt hard plate 3122, the second connecting belt hard plate 3132 is positioned on the side surface (that is, the third side surface 303) of the driving assembly 20 through at least two through holes of the second connecting belt hard plate 3132 and at least two hanging portions of the driving assembly 20, and the first connecting belt hard plate 3122 is positioned on the outer side of the second connecting belt hard plate 3132 located on the side surface (that is, the third side surface 303) of the driving assembly 20 through at least two through holes of the first connecting belt hard plate 3122 and at least two hanging portions of the driving assembly 20. The at least two hanging portions of the driving assembly 20 comprise a first hanging portion 22011 and a second hanging portion 22012 respectively extending outward from the lens driving fixing portion 2201 on both sides of the lens driving electrical connecting portion 2203, wherein the first hanging portion 22011 passes through the through hole of the second connecting belt hard plate 3132 and the through hole of the first connecting belt hard plate 3122, and the second hanging portion 22012 passes through the through hole of the first connecting belt hard plate 3122 and the through bole of the first connecting belt hard plate 3122, so that the first connecting belt hard plate 3122 and the second connecting belt hard plate 3132 are positioned on the driving assembly 20.

The first connecting belt hard plate 3122 and the second connecting belt hard plate 3132 are adapted to be bonded and fixed by an adhesive medium, such as UV glue, UV thermosetting glue, thermosetting glue, double-sided tape, etc.

Further, the second connecting belt hard plate 3132 is electrically connected with the first connecting belt hard plate 3122, so that the second connecting belt 313 is electrically connected with the third connecting belt flexible plate 3123 through the first connecting belt hard plate 3122, thereby being electrically connected with the connector portion 314. FIGS. 8-12*c* show a specific example of the present application, the second connecting belt hard plate 3132 comprises a plurality of connecting belt pads 31321, and the connecting belt pads 31321 are located on the side of the second connecting belt hard plate 3132 adjacent to the first connecting belt hard plate 3122 after the circuit board 31 is bent, in other words, in the flattened view of the circuit board 31 shown in FIG. 10, the side of the second connecting belt hard plate 3132 where the connecting belt pads 31321 are located is on the same side as the bottom surface of the circuit board body 311. The hard plate of the first circuit board 31 comprises a plurality of conductive holes, and the plurality of conductive holes comprise a plurality of first conductive holes 31221 and a plurality of second conductive holes 31222, when the first connecting belt and the second connecting belt 313 of the first circuit board 31 are bent, the plurality of first conductive holes 31221 of the first connecting belt hard plate 3122 are respectively opposite to the plurality of connecting belt pads 31321 of the second connecting belt hard plate 3132, thereby being adapted to electrically connect the plurality of first conductive holes 31221 with the plurality of connecting belt pads 31321 by providing electrical connection mediums 31322 in the plurality of first conductive holes 31221 to realize the electrical conduction between the first connecting belt hard plate 3122 and the second connecting belt hard plate 3132. Wherein, the electrical connection mediums 31322 can be solders such as tin balls, and the electrical connection mediums 31322 are fixed with the first conductive holes 31221 by means of laser welding and fixed with the connecting belt pads 31321, that is, the first connecting belt hard plate 3122 is electrically connected with the second connecting belt hard plate 3132 by welding. Compared with the traditional way of connecting through a connector, the process of pressing the connector can be avoided through electrically connecting the first connecting belt hard plate 3122 with the second connecting belt hard plate 3132 by the above mentioned welding method, thereby preventing the driving assembly from being pressed and reducing the occurrence of defective driving assembly.

Figures 12A, 12B, 12C:
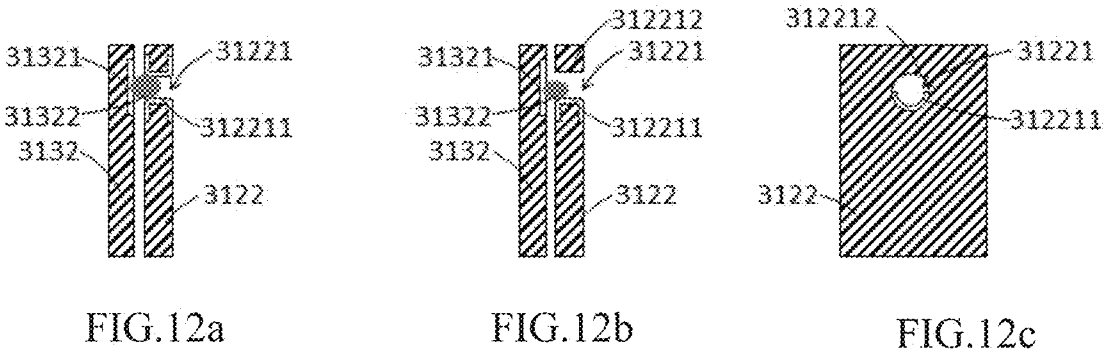
FIG. 12*a* shows a schematic view of the electrical connection of inner and outer hard plates with conductive holes having ring-shaped metal layer according to an embodiment of the present application.
FIG. 12*b* shows a schematic view of the electrical connection of inner and outer hard plates with conductive holes having no closed metal layer according to another embodiment of the present application.
FIG. 12*c* shows a schematic view of a hard plate with conductive holes having no closed metal layer according to another embodiment of the present application.

Specifically, FIGS. 12*a*-12*b* show a structural schematic view that the first connecting belt hard plate 3122 is welded with the second connecting belt hard plate 3132 through the electrical connection mediums 31322.

As shown in FIG. 12*a*, the connecting belt pads 31321 are located between the second connecting belt hard plate 3132 and the first connecting belt hard plate 3122, and the first conductive hole 31221 of the first connecting belt hard plate 3122 has a ring-shaped conductive side 312211 therein, and the conductive side 312211 of the first conductive hole 31221 is fixed and electrically connected with the connecting belt pad 31321 through the electrical connection medium 31322, thereby realizing the electrical conduction between the first connecting belt hard plate 3122 and the second connecting belt hard plate 3132, wherein, the ring-shaped conductive side 312211 can be realized by the metal plating layer disposed in the first conductive hole 31221.

FIGS. 12*b*-12*c* show another structure of the first conductive hole 31221, the first conductive hole 31221 is composed of a conductive side 312211 and an insulating side 312212, in other words, the metal plating layer disposed in the first conductive hole 31221 is only arranged on a part of the side surface of the first conductive hole 31221 (as shown in FIG. 12*c*, when observed along the direction perpendicular to the hard plate of the first circuit board 31, the conductive side 312211 and the insulating side 312212 are respectively located on two sides), and then, during welding, the electrical connection medium 31322 will lean towards the conductive side 312211, and the electrical connection medium 31322 is only contacted, fixed and electrically connected with the conductive side 312211 of the first conductive hole 31221, so that the connection contact state between the electrical connection medium 31322 and the connecting belt pad 31321 can be observed from the insulating side 312212 of the first conductive hole 31221 to the conductive side 312211, to observe whether there is a problem of dummy welding and reduce the defects of the camera module. Preferably, in one first conductive hole 31221, the ratio of the area occupied by the conductive side 312211 to the insulating side 312212 is between 0.8-1.25, for example, the area occupied by the conductive side 312211 and the area occupied by the insulating side 312212 are equal, so as to ensure the electrical connection between the first connecting belt hard plate 3122 and the second connecting belt hard plate 3132, and at the same time, it is convenient to observe the problem of dummy welding.

Further, in order to facilitate observing the welding states between the plurality of first conductive holes 31221 and the connecting belt pads 31321, preferably, in a preferred embodiment of the present application, the conductive sides 312211 of the plurality of first conductive holes 31221 are located on the same side, and the insulating sides 312212 of the plurality of first conductive holes 31221 are located on the other side, for example, the insulating sides 312212 of the plurality of first conductive holes 31221 are located on the upper side (that is, the side away from the circuit board body 311), so as to facilitate observing the welding states from the upper side of the camera module. Of course, the insulating sides 312212 of the plurality of first conductive holes 31221 may also be located on the lower side, left side or right side of the camera module, or may be located between the left side and the upper side, all of with can realize the visual observation of the welding states.

During the welding process, the electrical connection medium 31322, such as tin, needs to be heated to the melting point to contact and react with the connecting belt pad 31321 and the first conductive hole 31221. If the temperature is insufficient, the conductive connection medium 31322 cannot react with the connecting belt pad 31321 and the first conductive hole 31221, thereby resulting in the problem of dummy welding. When the electrical connection medium 31322 is sprayed between the connecting belt pad 31321 and the first conductive hole 31221 through the laser welding process, the excessive distance between the connecting belt pad 31321 and the first conductive hole 31221 could cause the electrical connection medium 31322 to be cooled down. Therefore, preferably, the gap between the connecting belt pad 31321 and the first conductive hole 31221 is less than 100 μm, and the gap between the first connecting belt hard plate 3122 and the second connecting belt hard plate 3132 is less than 100 μm.

In order to reduce the above mentioned problem of dummy welding, further secondary heating can be used to ensure the reactions between the electrical connection medium 31322 and the connecting belt pad 31321, and between the electrical connection medium 31322 and the first conductive hole 31221, thereby combining with each other to avoid the occurrence of the dummy welding problem.

Alternatively, the problem of dummy welding can also be reduced by pre-tinning. Pre-tinning refers to directly setting solder tin (or other electrical connection medium) on the connecting belt pad 31321 first, to enable the solder tin to react and bond with the pad, and then the molten solder tin is arranged between the connecting belt pad 31321 and the first conductive hole 31221 through the first conductive hole 31221 to achieve electrical conductivity. The material of the connecting belt pad 31321 is usually different from that of the electrical connection medium 31322. During welding, the two need to react on the contact surface to ensure a stable combination, and the reaction process requires high temperature. In an embodiment of the present application, a layer of tin can be provided on the surface of the connecting belt pad 31321 by pre-tinning, so in the subsequent welding process, the solder tin and the tin on the surface of the connecting belt pad 31321 are easily combined, and the distance between the surface of the connecting belt pad 31321 and the first conductive hole 31221 is also shortened, and the temperature of the solder tin can still be kept relatively high when it is arranged on the surface of the connecting belt pad 31321, thereby having a better welding effect, and can reduce the demand on the welding process. Preferably, the thickness of the solder tin is between 10-50 μm to maintain a good welding effect.

Further, in an embodiment of the present application, the electrical connection between the driving assembly 20 and the circuit board 31 can also be realized by the above mentioned first conductive hole-pad welding. As shown in FIGS. 4-5, 10-11, the second connecting belt hard plate 3132 is provided with a concaving portion, so that when the second connecting belt hard plate 3132 is bent and hung on the first banging portion 22011 and the second hanging portion 22012, it avoids the lens driving electrical connecting portion 2203 of the driving assembly 20, to expose the lens driving electrical connecting portion 2203, so as to be adapted to be electrically connected with the first connecting belt hard plate 3122. Specifically, the plurality of lens driving pads 22031 of the lens driving electrical connecting portion 2203 correspond to the plurality of second conductive holes 31222 of the first connecting belt hard plate 3122, and are electrically connected through the electrical connection mediums 31322.

The plurality of lens driving pads 22031 of the lens driving electrical connecting portion 2203 are arranged in two rows to reduce the length of the lens driving electrical connecting portion 2203, for example, the number of the lens driving pads 22031 located in the upper row is four, and the number of the lens driving pads 22031 located in the lower row is also four. Further, in order to reduce the size of the lens driving electrical connecting portion 2203 in the Z-axis direction, the upper and lower rows of the lens driving pads 22031 are interlaced with each other, and in order to improve the utilization of the area of the lens driving electrical connecting portion 2203, the lens driving pad 22031 has a large size on one side and a small size on the other side, that is, a "gourd" shaped pad, and the size of the side of the lens driving pad 22031 close to the edge of the lens driving electrical connecting portion 2203 is relatively larger.

The lens driving electrical connecting portion 2203 is a combination plate with flexible plate and hard plate, and the flexible plate portion of the lens driving electrical connecting portion 2203 is electrically connected with the driving element of the lens driving portion 22 and the hard plate portion of the lens driving electrical connecting portion 2203, the plurality of lens driving pads 22031 are located on the hard plate portion of the lens driving electrical connecting portion 2203, and the hard plate portion of the lens driving electrical connecting portion 2203 is fixed on the side surface of the lens driving fixing portion 2201 of the lens driving portion 22 to maintain the stability of the electrical connection between the lens driving electrical connecting portion 2203 and the external power supply. Further, the outer surface of the lens driving pad 22031 is lower than the outer surface of the hard plate portion of the lens driving electrical connecting portion 2203, so as to provide protection for the lens driving pad 22031 and prevent the lens driving pad 22031 from being scratched, and avoid affecting the yield of electrical connections.

In an embodiment of the present application, the plurality of second conductive holes 31222 of the first connecting belt hard plate 3122 are also composed of a conductive side 312211 and an insulating side 312212, so as to facilitate observing the welding states between the second conductive holes 31222 and the lens driving pads 22031. Preferably, the conductive sides 312211 of the plurality of second conductive holes 31222 are located on the same side, and the insulating sides 312212 of the plurality of the second conductive holes are located on the other side, for example, the conductive sides 312211 of the plurality of second conductive holes 31222 are located on the lower side (that is, the side close to the circuit board body 311), so as to facilitate observing the welding states from the upper side of the camera module. Of course, the conductive sides 312211 of the plurality of second conductive holes 31222 may also be located on the upper side, left side or right side of the camera module, or may be located between the right side and the lower side, all of with can realize the visual observation of the welding states.

In order to improve the welding yield between the second conductive hole 31222 and the lens driving pad 22031 and reduce the risk of dummy welding, the gap between the second conductive hole 31222 and the lens driving pad 22031 is preferably less than 100 μm, that is, the gap between the first connecting belt hard plate 3122 and the lens driving electrical connecting portion is less than 100 μm. Moreover, the second conductive hole 31222 and the lens driving pad 22031 can also be welded by secondary heating or pre-tinning. When pre-tinning is used for welding, the thickness of the solder tin is between 10-50 μm to maintain a good welding effect.

That is, the conductive hole-pad welding structure according to the present application can also be applied to the electrical connection between the driving assembly 20 and the circuit board 31. The driving assembly 20 comprises a driving electrical connecting portion (such as the lens driving electrical connecting portion 2203) located on the side surface of the driving assembly 20, and a plurality of bonding pads (such as the lens driving pads 22031) of the driving electrical connecting portion correspond to a plurality of conductive holes of the hard plate portion (such as the first connecting belt hard plate 3122) of the circuit board, and are electrically connected through the electrical connection mediums disposed in the conductive holes.

The conductive hole-pad welding structure according to the present application can be applied when the electrical connecting portion of the camera module is disposed on the side surface of the camera module, so as to avoid the camera module being under pressure during electrical conduction, and avoid causing defects of the camera module. Wherein, the electrical connecting portion is disposed on the side surface of the camera module, for example, the electrical connecting portion of the driving assembly 20 can be disposed on the side surface, or the electrical connecting portion of the photosensitive assembly 30 can be disposed on the side surface, by welding the circuit board 31 provided with conductive boles with the electrical connecting portion, the driving assembly 20 or the photosensitive assembly 30 is electrically conductive to the mobile electronic device.

Further, in order to maintain the shape of the circuit board 31 after being bent, especially the bending of the first bending portion 31211 and the fourth bending portion 31311, the reinforcing plate 37 can also be bent, to maintain the bending of the first connecting belt flexible plate 3121 at the first bending portion 31211, and to maintain the bending of the second connecting belt flexible plate 3131 at the fourth bending portion 31311.

Figure 13:
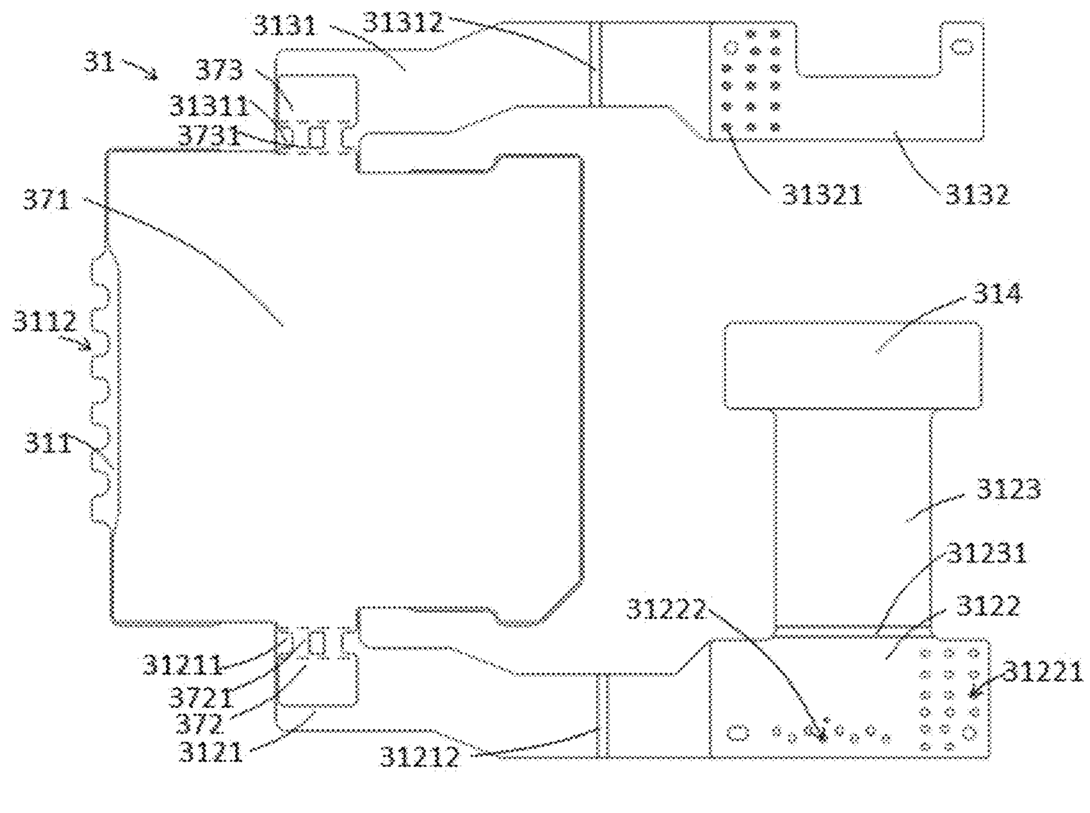
FIG. 13 shows a schematic top view of a hanging type circuit board attached with a reinforcing plate in a flattened state according to an embodiment of the present application.
Figure 14:
FIG. 14 shows a schematic side view of the reinforcing plate and the hanging type circuit board in a bent state according to an embodiment of the present application.
Figure 15:
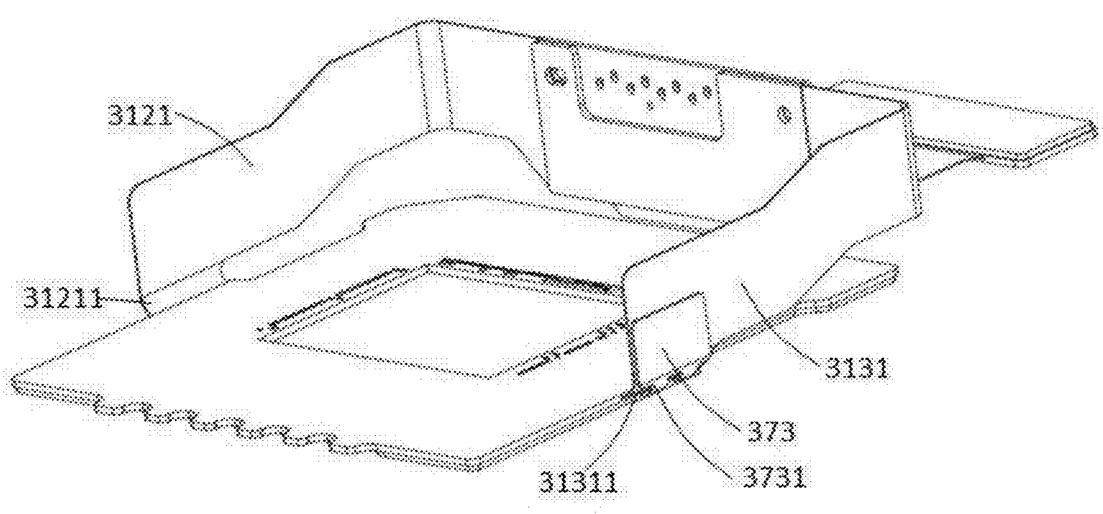
FIG. 15 shows a schematic perspective view of the reinforcing plate and the hanging type circuit board in a bent state according to an embodiment of the present application.

Specifically, FIGS. 13-15 show a schematic view that the reinforcing plate 37 is attached to the bottom surface of the circuit board body 311, wherein the reinforcing plate 37 comprises a reinforcing plate body 371, a first reinforcing plate side portion 372 and a second reinforcing plate side portion 373, and the reinforcing plate body 371, the first reinforcing plate side portion 372 and the second reinforcing plate side portion 373 may be integrally formed. The first reinforcing plate side portion 372 further comprises a first reinforcing plate bending portion 3721, the second reinforcing plate side portion 373 further comprises a second reinforcing plate bending portion 3731, and the reinforcing plate is attached and fixed on the bottom surface of the circuit board body 311 through the reinforcing plate body 371, so that the reinforcing plate body 371 and the circuit board body 311 provided with the circuit board through hole 3111 form a concave groove for accommodating the photosensitive chip 32, wherein the first reinforcing plate side portion 372 is fixedly connected to one side (located on the same side as the first connecting belt flexible plate 3121, i.e. the first side surface 301) of the reinforcing plate body 371 through the first reinforcing plate bending portion 3721, the second reinforcing plate side portion 373 is fixedly connected to the other side (located on the same side as the second connecting belt flexible plate 3131, i.e. the second side surface 302) of the reinforcing plate body 371 opposite to the first reinforcing plate side portion 372 through the second reinforcing plate bending portion 3731. Preferably, the material of the reinforcing plate 37 is a metal material adapted to be bent, such as stainless steel, copper and the like.

Through the bending of the first reinforcing plate bending portion 3721, the first reinforcing plate side portion 372 is bent along the first side surface 301 of the reinforcing plate body 371 and is extended upwards, and through the bending of the second reinforcing plate bending portion 3731, the second reinforcing plate side portion 373 is bent along the second side surface 302 of the reinforcing plate body 371 and is extended upwards. The shapes of the first reinforcing plate side portion 372 and the second reinforcing plate side portion 373 after being bent are not easy to change, therefore, the first reinforcing plate side portion 372 and the second reinforcing plate side portion 373 are adapted to keep the bending of the first bending portion 31211 and the fourth bending part 31311, and maintain the shapes of the first connecting belt flexible plate 3121 and the second connecting belt flexible plate 3131 after being bent, thereby reducing the resistance force of the first connecting belt 312 and the second connecting belt 313 when the driving assembly 20 drives the circuit board body 311 to move.

The width of the first reinforcing plate bending portion 3721 is smaller than the width of the first reinforcing plate side portion 372, thereby reducing the difficulty of bending the first reinforcing plate bending portion 3721, further, the first reinforcing plate bending portion 3721 has a through hole, which further reduces the resistance force of bending the first reinforcing plate bending portion 3721. The width of the second reinforcing plate bending portion 3731 is smaller than the width of the second reinforcing plate side portion 373, thereby reducing the difficulty of bending the second reinforcing plate bending portion 3731, further, the second reinforcing plate bending portion 3731 has a through hole, which further reduces the resistance force of bending the second reinforcing plate bending portion 3731.

Figure 16:
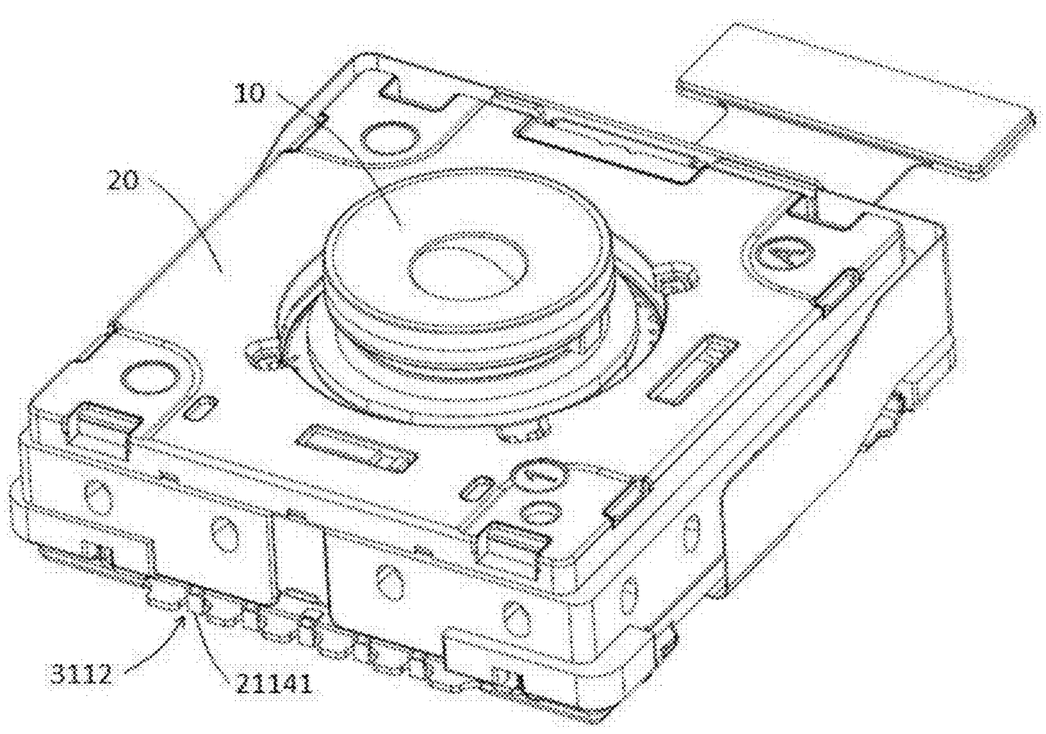
FIG. 16 shows a schematic perspective view of a camera module with a circuit board having a side concaving portion according to an embodiment of the present application.
Figure 17:
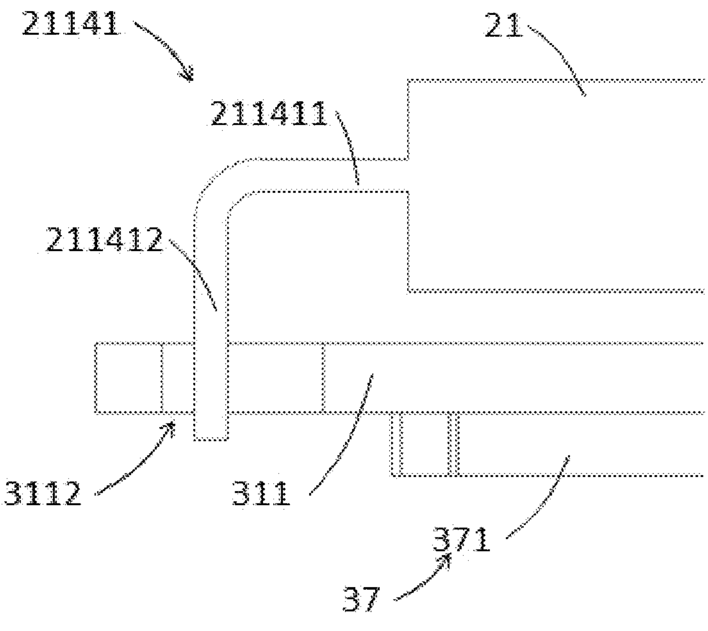
FIG. 17 shows a partial schematic view of the electrical connection between the side concaving portion of the circuit board and the conductive pin of the optical actuator according to an embodiment of the present application.

As shown in FIGS. 16-17, in an embodiment of the present application, the chip anti-shake electrical connecting portion 2114 of the chip anti-shake portion 211 is electrically connected to the circuit board body 311 by pin welding.

Specifically, in the assembly of the camera module 1, the optical lens 10 is assembled on the driving assembly 20, and the driving assembly 20 is fixed on the circuit board body 311 and electrically connected to the circuit board body 311, thereby reducing the height of the camera module. The driving assembly 20 is fixed to the circuit board body 311 by HA process or AA process for assembling. The HA process refers to directly bonding and fixing the driving assembly 20 and the circuit board 31 through an adhesive medium after adjusting the parallelism, which generally requires about 0.03 mm to be reserved for the gap between the drive assembly 20 and the circuit board body 311; and the AA process refers to the active calibration process, which first assembles the optical lens 10 to the driving assembly 20 to form a semi-finished camera module, and then adjusts the positional relationship between the semi-finished camera module and the circuit board body 311 according to the imaging quality of the image formed by the photosensitive assembly 30 receiving light from the semi-finished camera module, and then bonds and fixes through the adhesive medium, and it usually requires about 0.16 mm to be reserved for the gap between the drive assembly 20 and the circuit board body 311. Therefore, no matter through the HA process or the AA process, when the driving assembly 20 and the circuit board body 311 are bonded and fixed in order to reduce the height of the camera module, the gap between the driving assembly 20 and the circuit board body 311 will be lower.

In an embodiment of the present application, the chip anti-shake electrical connecting portion 2114 comprises a plurality of pins 21141, and the pins 21141 comprise a lateral portion 211411 fixedly connected with the chip anti-shake fixing portion 2111 and a vertical portion 211412 integrally formed with the lateral portion 211411 and perpendicular (approximately vertical) to the lateral portion 211411, and the vertical portion 211412 of the pin 21141 determines the height of the pin 21141, and the size of ordinary pin is 0.5 mm, which is far beyond the gap between the driving assembly 20 and the circuit board body 311. However, in the existing camera module, the pins are usually welded on the circuit board 31, and a 0.2 mm gap needs to be reserved between the pins and the circuit board 31. For the present application, this will cause an increase in the gap between the driving assembly 20 and the circuit board body 311, thereby increasing the height of the camera module, which is inconsistent with the need to reduce the height of the camera module.

Therefore, in some embodiments of the present application, the circuit board body 311 is provided with a plurality of side concaving portions 3112, and the plurality of side concaving portions 3112 are located on one side of the circuit board body 311 and on the positions corresponding to the plurality of pins 21141 of the chip anti-shake connecting portion, and the pins 21141 pass through the circuit board body 311 through the side concaving portions 3112, and the pins 21141 are electrically connected with the side concaving portions 3112 by arranging an electrical connection medium. Specifically, the surface of the side concaving portion 3112 has a metal plating layer, so that it can be welded and fixed with the electrical connection medium and electrically conducted. Through the above structure, the gap between the driving assembly 20 and the circuit board body 311 is not limited by the size of the pins 21141 and the welding process, thereby reducing the height of the camera module.

FIG. 17 shows a schematic view of the relative positional relationship between the pin 21141 and the circuit board body 311 according to an embodiment of the present application. The vertical portion 211412 of the pin 21141 preferably protrudes from the bottom surface (i.e., the back side surface of the circuit board body 311) of the circuit board body 311, that is, the bottom surface of the vertical portion 211412 of the pin 21141 is lower than the bottom surface of the circuit board body 311, so that The bottom surface of the circuit board main body 311, so that the electrical connection medium can have a larger contact area with the side surface of the pin 21141, so as to improve the welding yield and ensure the effect of electrical connection. When the bottom surface of the circuit board body 311 is further attached with a reinforcing plate, preferably, the reinforcing plate 37 is not attached to the bottom surface of the side concaving portion 3112, and the bottom surface of the vertical portion 211412 of the pin 21141 does not protrude from the bottom surface of the reinforcing plate 37, that is, the bottom surface of the vertical portion 211412 of the pin 21141 is preferably between the bottom surface of the circuit board body 311 and the bottom surface of the reinforcing plate 37, so that reinforcing plate 37 can protect the pin 21141 and reduce the risk of short circuit caused by contact between the pin 21141 and other components. It should be noted that, in other embodiments of the present application, the bottom surface of the vertical portion 211412 of the pin 21141 may also protrude from the bottom surface of the reinforcing plate 37, or, the bottom surface of the vertical portion 211412 of the pin 21141 may not protrude from the bottom surface of the circuit board body 311, that is, the bottom surface of the vertical portion 211412 of the pin 21141 may also be higher than the bottom surface of the circuit board body 311, and is located between the upper surface and the bottom surface of the circuit board body 311.

Further, the angle between the vertical portion 211412 and the lateral portion 211411 is between 80°-100°, and when the vertical portion 211412 is perpendicular to the lateral portion 211411, the angle between the vertical portion 211412 and the lateral portion 211411 is 90°. In a preferred embodiment of the present application, the vertical portion 211412 has an inclination angle greater than 0° and less than 10° relative to the vertical line of the lateral portion 211411, so that the length of the vertical portion 211412 can be longer at the same height, to reduce the difficulty of the manufacturing process of the pin.

Observing the camera module as a whole, the first connecting belt flexible plate 3121 is located on the first side surface 301 of the camera module 1, the second connecting belt flexible plate 3131 is located on the second side surface 302 of the camera module 1, the lens driving electrical connecting portion 2203 of the lens driving portion 22, the first connecting belt hard plate 3122 and the second connecting belt hard plate 3132 are located on the third side surface 303 of the camera module 1, and the chip anti-shake electrical connecting portion 2114 of the chip driving portion 21 is located on the fourth side surface 304 of the camera module 1. Through the above arrangement, the above components do not interfere with each other, so as to reduce their impact on the chip stabilization of the camera module.

FIGS. 18-21 show schematic views of the outer frame 40 according to the present application, and the outer frame 40 comprises a frame body 41, a frame cover 42 and a frame bottom plate 43.

The frame body 41 has a through hole, thereby accommodating the driving assembly 20, and the driving assembly 20 is fixed to the frame body 41 by an adhesive medium, thereby providing a supporting position for the driving assembly 20.

The frame bottom plate 43 is fixed on the bottom surface of the frame body 41, thereby protecting the photosensitive assembly 30, and a gap is provided between the frame bottom plate 43 and the bottom surface of the photosensitive assembly 30, so that the frame bottom plate 43 will not interfere with the movement of the photosensitive assembly 30 when the photosensitive assembly 30 is driven by the chip anti-shake portion 211 of the driving assembly 20. Further, the frame bottom plate 43 may also be provided with a through bole, and the through hole of the frame bottom plate 43 corresponds to the chip anti-shake electrical connecting portion 2114 of the chip anti-shake portion 211 of the driving assembly 20, thereby providing greater space for the pin 21141, avoiding the contact between the pin 21141 and the frame bottom plate 43, and reducing the risks of mutual interference and circuit short circuit.

The frame cover 42 is fixed on the top surface of the frame body 41, thereby cooperating with the frame body 41 to package the driving assembly 20, and reducing the risk that the dust and other dirt fall between the driving assembly 20 and the frame body 41. The frame cover 42 has a through hole, and the through hole of the frame cover 42 is adapted to provide the incident light to the optical lens 10, and can allow the optical lens 10 to pass through, so that the optical lens 10 protrudes from the frame cover 42.

Figure 20:
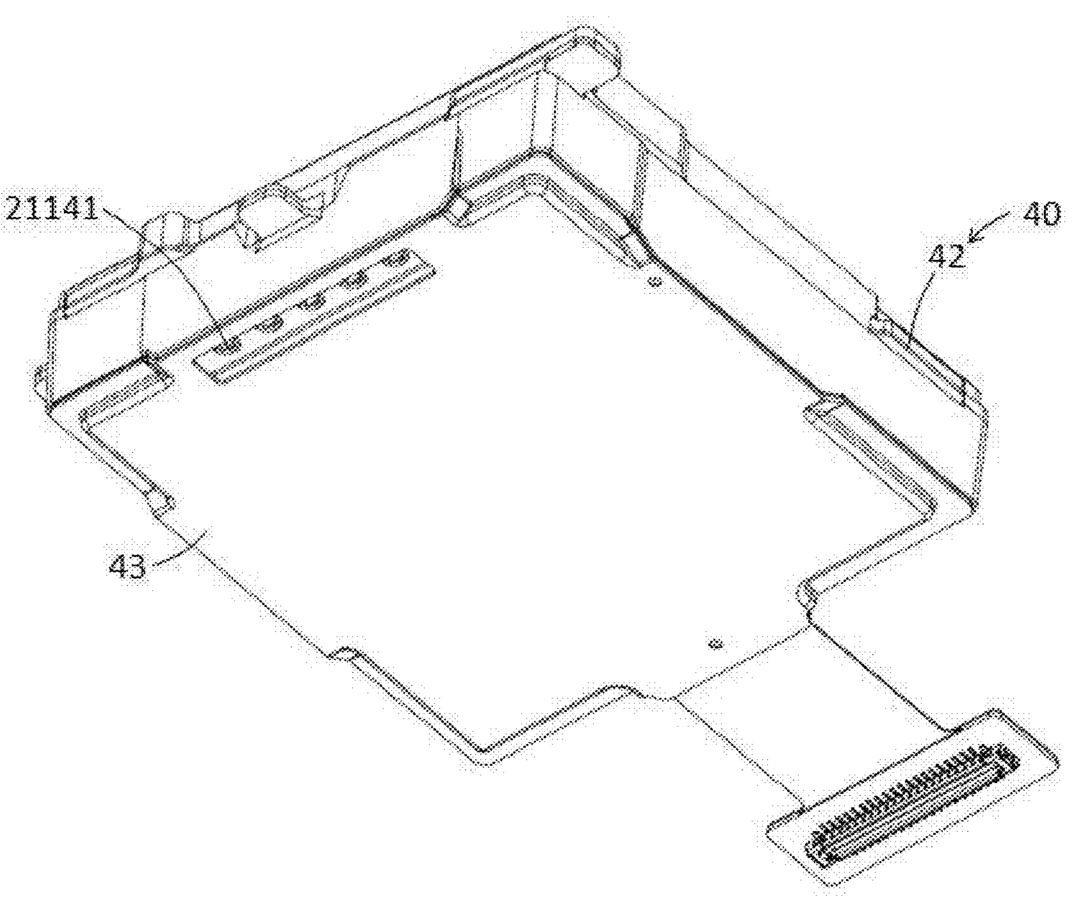
FIG. 20 shows a schematic view of the positional relationship of a frame bottom plate and the hanging type circuit board according to an embodiment of the present application.
Figure 21:
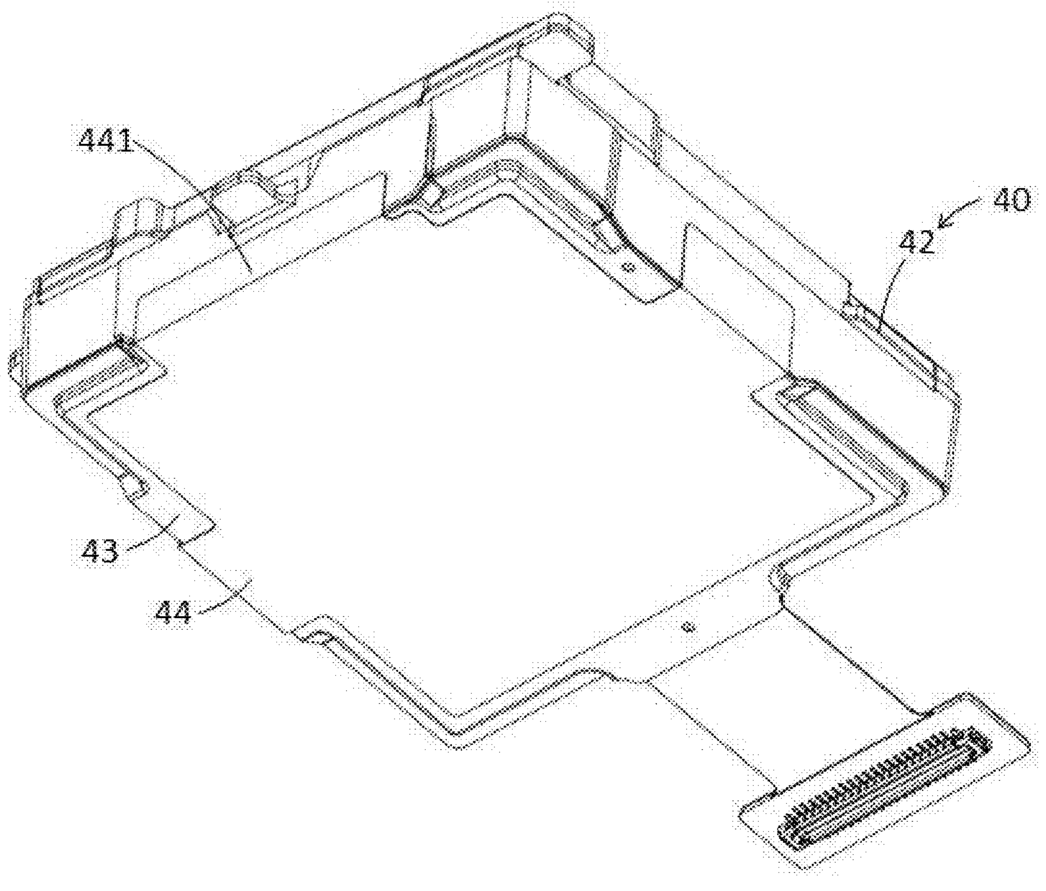
FIG. 21 shows the positional relationship of a conductive fabric, a frame bottom plate and the hanging type circuit board according to an embodiment of the present application.

Further, as shown in FIGS. 20-21, the outer frame 40 further comprises a conductive fabric 44, and the conductive fabric 44 is attached to the bottom surface of the frame bottom plate 43. The conductive fabric 44 can cover the through hole of the frame bottom plate 43, so that dirt such as dust will not enter the camera module. The conductive fabric 44 may also comprise a conductive fabric side portion 441, and the conductive fabric 44 is further attached to the side surface of the frame body 41 through the conductive fabric side portion 441. When the frame body 41 is made of metals such as aluminum, stainless steel and the like, the conductive fabric 44 can electrically conduct with the frame body 41, to achieve effects such as conductivity, electromagnetic shielding and the like. The conductive fabric 44 may comprise one or more conductive fabric side portions 441, and in a specific example of the present application, the number of the conductive fabric side portions 441 is four, and are respectively arranged on the four sides of the frame body 41.

Figure 18:
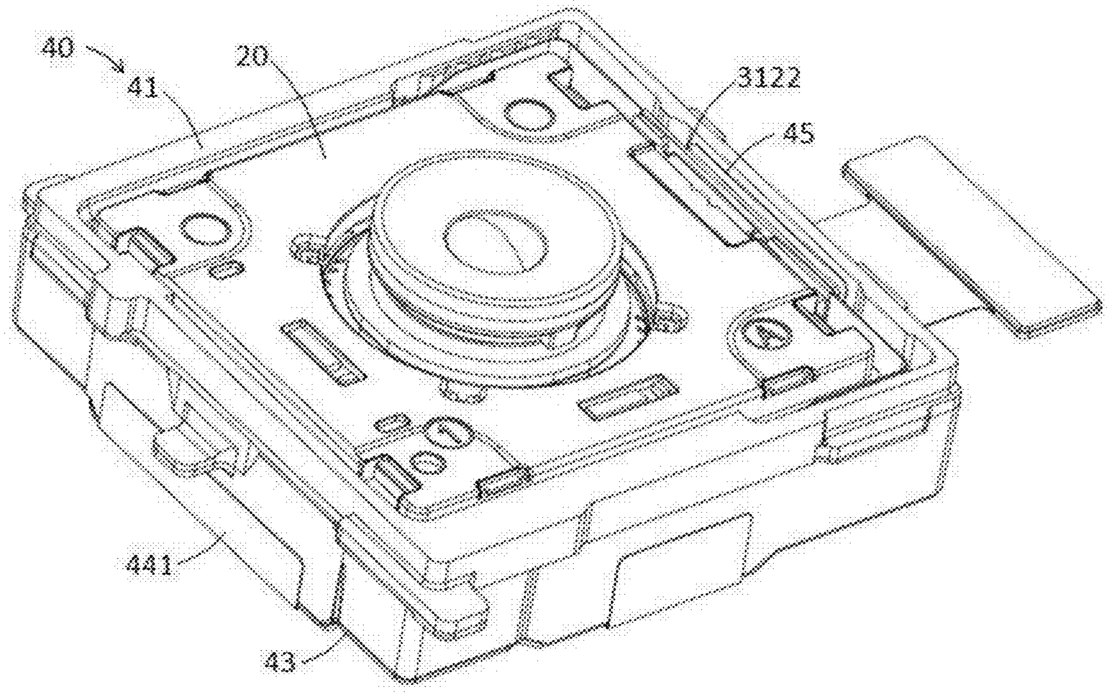
FIG. 18 shows a schematic perspective view of a camera module with an outer frame according to an embodiment of the present application.
Figure 19:
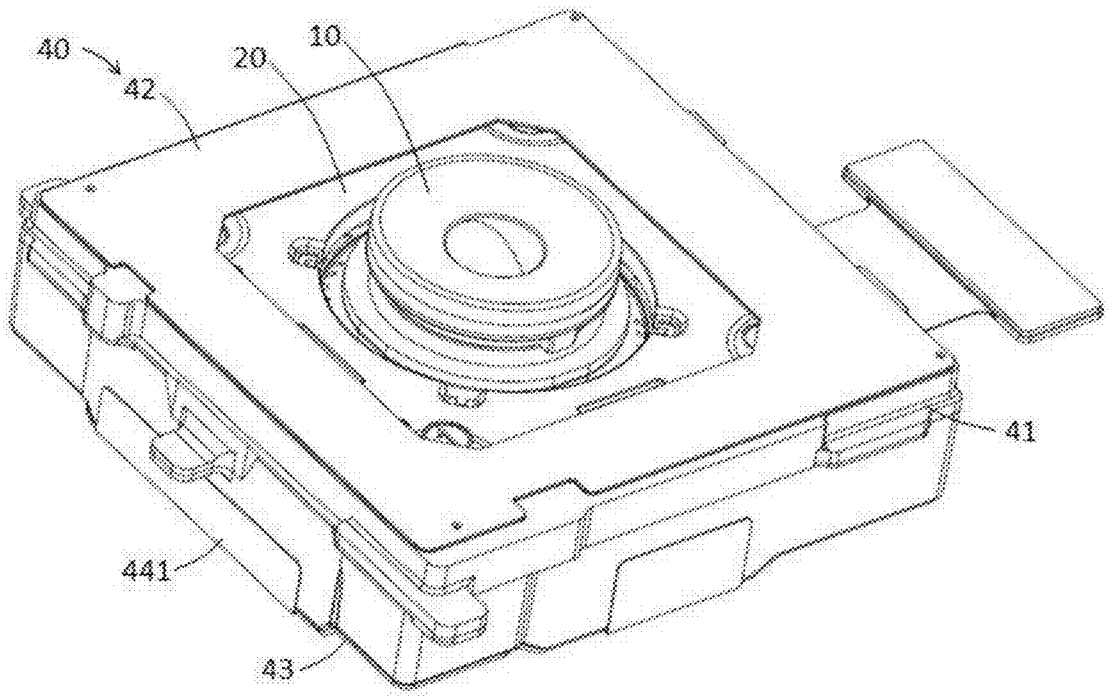
FIG. 19 shows a schematic perspective view of a camera module with a frame cover added according to an embodiment of the present application.

Further, as shown in FIG. 18, the outer frame 40 further comprises an insulating sheet 45, and the insulating sheet 45 is disposed between the first connecting belt hard plate 3122 and the frame body 41. When the material of the frame body 41 is a conductive material, there is a risk that the contact between the frame body 41 and the first hard plate causes a short circuit of the first hard plate, so the insulating sheet 45 is disposed between the first connecting belt hard plate 3122 and the frame body 41 to reduce the above risk. Specifically, the insulating sheet 45 can be bonded and fixed on the inner side of the frame body 41, or can be bonded and fixed on the outer side of the first connecting belt hard plate 3122, or the insulating sheet 45 is only placed between the first connecting belt hard plate 3122 and the frame body 41.

In the present application, the main portions of the first connecting belt and the second connecting belt are arranged on the peripheral side of the optical element of the camera module, and can therefore be referred to as lateral connecting belt. In the lateral connecting belt, the portion that bent upwardly from the side surface of the circuit board body can be referred to as bending portion (or referred to as upward bending portion, and the bending portion may be regarded as a part of the lateral connecting belt). The portion arranged on the peripheral side of the optical element of the camera module can be referred to as lateral connecting belt body. The surface of the lateral connecting belt body may be substantially perpendicular to the surface of the circuit board body. In some embodiments, the lateral connecting belt and the circuit board body can be integrally formed, for example, the lateral connecting belt and the circuit board body can be integrally formed through the fabrication process of a combination plate with flexible plate and hard plate. Wherein the circuit board body can be a hard plate (such as a PCB board), the bending portion of the lateral connecting belt can be a flexible plate (such as an FPC board), and the lateral connecting belt body can comprise a part of flexible plate and a part of hard plate. Wherein, the part of the hard plate can be used to hang the lateral connecting belt on the static member of the optical actuator (such as the actuator fixing portion).

In the present application, the optical element refers to the element used to form an imaging optical system, generally comprising a plurality of lenses for imaging and a photosensitive element (usually a photosensitive chip). A plurality of lenses for imaging and their supporting members (such as lens barrel) can constitute the optical lens. The photosensitive element is located in the photosensitive assembly.

In the above mentioned embodiments, the driving assembly 20 constitutes an optical actuator. The optical actuator may be a dual OIS optical actuator, that is, the optical actuator is provided a lens driving portion and a chip driving portion. The optical actuator may comprise an actuator fixing portion and an actuator movable portion. The actuator fixing portion may comprise a lens driving fixing portion and a chip anti-shake fixing portion, and the two may be fixed together. The actuator movable portion may comprise a lens driving movable portion and a chip anti-shake movable portion.

In the present application, the surface of the hard plate or connecting belt refers to the surface perpendicular to the thickness direction of the hard plate or connecting belt (that is, the normal direction of the surface is consistent with the thickness direction of the hard plate). Each hard plate or connecting belt comprises two surfaces, the surface close to the inner side (that is, the side close to the optical axis) is the inner surface, and the surface close to the outer side (that is, the side away from the optical axis) is the outer surface.

In the present application, the photosensitive chip and/or optical actuator of the camera module usually have circuits for supplying power and/or realizing certain corresponding functions, and these circuits can be arranged on one or more circuit boards. For the convenience of description, all substrates in the camera module used for power supply and/or arranging functional circuits and the connecting members of these substrates are referred to as circuit board structures herein.

In some embodiments of the present application, the camera module comprises an optical actuator, an optical lens, and a photosensitive assembly; wherein, the optical actuator is provided with a chip anti-shake portion. At least one side surface of the chip anti-shake portion is provided with a plurality of conductive pins, and at least one side surface of the circuit board body is provided with a plurality of side concaving portions, and each of the side concaving portions is formed by the inward concavity of the side surface of the circuit board body, and the conductive pin is extended into the side concaving portion, and the conductive pin is electrically connected with the side concaving portion by a welding medium. The chip anti-shake portion comprises a chip anti-shake fixing portion and a chip anti-shake movable portion. In a preferred embodiment, the plurality of conductive pins is led out from at least one side surface of the chip anti-shake movable portion. In the preferred embodiment, the conductive pin is led out from the chip anti-shake movable portion, and is electrically connected with the side concaving portion of the circuit board body, so as to adapt well to the chip anti-shake movement while achieving electrical connection between the chip anti-shake portion and the circuit board body. During the chip anti-shake moving process, the chip anti-shake movable portion and the circuit board body move together, that is, the chip anti-shake movable portion and the circuit board body are relatively stationary. It should be noted that in FIG. 3 of the present application, some lines of the chip anti-shake fixing portion and the chip anti-shake movable portion are omitted in order to make the drawing simple. In fact, in the preferred embodiment of the present application, the conductive pins for being electrically connected with the side concaving portion are led out from the side surface of the chip anti-shake movable portion (not the chip anti-shake fixing portion).

Further, in some embodiments of the present application, the frame bottom plate is provided with a pin avoiding through hole; the pin avoiding through hole may be located directly below the side concaving portion, and the size of the pin avoiding through hole is greater than the size of the side concaving portion when viewed from an upward angle, and a distance not less than 15 μm is provided between the outline of the pin avoiding through hole and the outline of the side concaving portion; the depth of the side concaving portion is 15 to 25 μm. The depth of the side concaving portion is the distance inwardly recessed from the side surface of the circuit board body.

Further, in some embodiments of the present application, the side concaving portions are provided on the side surface of the circuit board body, the conductive pins (i.e., motor pins) are provided on the side surface of the optical actuator, and then the conductive pins extend into or pass through the side concaving portions of the side surface of the circuit board body, and then apply a welding medium from the outer side to weld the conductive pins to the side concaving portions. This design solution can reduce the height occupied by the welding of the motor pins, thereby reducing the height of the camera module with the optical actuator. The pin-side concaving portion welding solution is especially suitable for dual OIS camera modules, or camera modules with chip anti-shake function, and can also be suitable for AF modules (i.e., auto-focus camera modules).

The above description is only preferred examples of the present application and an illustration of the applied technical principles. Those skilled in the art should understand that the scope of the invention involved in this application is not limited to the technical solutions formed by the specific combinations of the above-mentioned technical features, but should also cover other technical solutions formed by any combinations of the above-mentioned technical features or the equivalent features thereof without departing from the inventive concept. For example, a technical solution formed by replacing the above-mentioned features with technical features with similar functions disclosed in (but not limited to) this application.

What is claimed is:

1. A camera module, comprising:

a photosensitive assembly;

an optical lens held in a photosensitive path of the photosensitive assembly;

a driving assembly for driving the photosensitive assembly to move; and an outer frame for accommodating the driving assembly and the photosensitive assembly therein, wherein the photosensitive assembly comprises a circuit board and a photosensitive chip, wherein the photosensitive chip is fixed at the circuit board, wherein the circuit board comprises a circuit board body and at least two lateral connecting belts, wherein the at least two lateral connecting belts lead out from two opposite sides of the circuit board body, wherein a plurality of connecting belt pads are provided on an outer surface of a connecting belt hard plate of one of the at least two lateral connecting belts, a plurality of conductive holes are formed in the connecting belt hard plate of another of the at least two lateral connecting belts, wherein a plurality of electrical connection mediums are provided in the plurality of conductive holes respectively, wherein each of the at least two lateral connecting belts is bent to make the plurality of connecting belt pads be corresponded to the plurality of conductive holes, such that the plurality of electrical connection mediums are capable of being electrically connected with the plurality of connecting belt pads respectively.

2. The camera module, as recited in claim 1, wherein the plurality of electrical connection mediums are attached on sidewalls of the plurality of conductive holes respectively and passed through the plurality of conductive holes to be physically contacted with and electrically connected with the plurality of connecting belt pads respectively, wherein each of the plurality of electrical connection mediums is a metal plating layer attached on a sidewall of a corresponding conductive hole.

3. The camera module, as recited in claim 2, wherein the plurality of electrical connection mediums is are attached on the plurality of connecting belt pads and the side walls of the plurality of conductive holes respectively.

4. The camera module, as recited in claim 1, wherein each of the plurality of electrical connection mediums is attached on a corresponding conductive hole to form a ring-shaped conductive side.

5. The camera module, as recited in claim 1, wherein each of the plurality of electrical connection mediums is attached on a part of a sidewall of a corresponding conductive hole to form a conductive side and an insulating side.

6. The camera module, as recited in claim 5, wherein the conductive side and the insulating side are located on two different sides of the sidewall of the corresponding conductive hole, and the area ratio of the conductive side and the insulating side is 0.18~1.25.

7. The camera module, as recited in claim 5, wherein the conductive side is respectively formed on one same side of the sidewalls of the plurality of conductive holes, and the insulating side is respectively formed on another same side of the sidewalls of the plurality of conductive holes.

8. The camera module, as recited in claim 1, wherein a gap between each of the connecting belt pads and a corresponding conductive hole is less than 100 μm.

9. The camera module, as recited in claim 1, wherein the at least two lateral connecting belts comprise a first connecting belt and a second connecting belt, wherein the first connecting belt and the second connecting belt are lead from two opposite sides of the circuit board body, wherein the first connecting belt comprises a first connecting belt flexible plate and a first connecting belt hard plate, and wherein the second connecting belt comprises a second connecting belt flexible plate and a second connecting belt hard plate, wherein the first connecting belt hard plate forms the plurality of conductive holes, the plurality of electrical connection mediums are provided in the plurality of conductive holes respectively, the plurality of connecting belt pads are provided on an outer surface of the second connecting belt hard plate, wherein each of the first connecting belt and the second connecting belt is bent to enable the plurality of conductive holes of the first connecting belt hard plate of the first connecting belt is capable of being corresponded to the second connecting belt hard plate of the second connecting belt.

10. The camera module, as recited in claim 9, wherein the at least two lateral connecting belts comprise a third connecting belt comprising a third connecting belt flexible plate, wherein the first connecting belt flexible plate has a first bending portion and a second bending portion, the third connecting belt flexible plate has a third bending portion and the second connecting belt flexible plate has a fourth bending portion and a fifth bending portion, wherein the first bending portion is bent upwardly from a first side of the circuit board body, and the second bending portion is bent upwardly from the first side to the third side of the circuit board body so as to facilitate the first connecting belt flexible plate and the first connecting belt hard plate disposed on the third side of the circuit board body to be connected with each other; the fourth bending portion of the second connecting belt flexible plate is bent upwardly from a second side of the circuit board body, and the fifth bending portion is bent upwardly from the first side to the third side of the circuit board body, so as to facilitate the second connecting belt flexible plate and the second connecting belt hard plate disposed on the third side to be connected with each other, wherein the first side and the third side are opposite to each other.

11. A circuit board for a camera module, comprising:

a circuit board body; and at least two lateral connecting belts, wherein the at least two lateral connecting belts lead out from two opposite sides of the circuit board body, wherein a plurality of connecting belt pads are provided on an outer surface of a connecting belt hard plate of one of the at least two lateral connecting belts, a plurality of conductive holes are formed in the connecting belt hard plate of another of the at least two lateral connecting belts, wherein a plurality of electrical connection mediums are provided in the plurality of conductive holes respectively, wherein each of the at least two lateral connecting belts is bent to make the plurality of connecting belt pads be corresponded to the plurality of conductive holes, such that the plurality of electrical connection mediums are capable of being electrically connected with the plurality of connecting belt pads respectively.

12. The circuit board for a camera module, as recited in claim 11, wherein the plurality of electrical connection mediums are attached on sidewalls of the plurality of conductive holes respectively and passed through the plurality of conductive holes to be physically contacted with and electrically connected with the plurality of connecting belt pads respectively, wherein each of the plurality of electrical connection mediums is a metal plating layer attached on a sidewall of a corresponding conductive hole.

13. The circuit board for a camera module, as recited in claim 12, wherein the plurality of electrical connection mediums are attached on the plurality of connecting belt pads and the side walls of the plurality of conductive holes respectively.

14. The circuit board for a camera module, as recited in claim 11, wherein each of the plurality of electrical connection mediums is attached on a corresponding conductive hole to form a ring-shaped conductive side.

15. The circuit board for a camera module, as recited in claim 11, wherein each of the plurality of electrical connection mediums is attached on a part of a sidewall of a corresponding conductive hole to form a conductive side and an insulating side.

16. The circuit board for a camera module, as recited in claim 15, wherein the conductive side and the insulating side are located on two different sides of the sidewall of the corresponding conductive hole, and the area ratio of the conductive side and the insulating side is 0.18~1.25.

17. The circuit board for a camera module, as recited in claim 15, wherein the conductive side is respectively formed on one same side of the sidewalls of the plurality of conductive holes, and the insulating side is respectively formed on another same side of the sidewalls of the plurality of conductive holes.

18. The circuit board for a camera module, as recited in claim 11, wherein a gap between each of the connecting belt pads and a corresponding conductive hole is less than 100 μm.

19. The circuit board for a camera module, as recited in claim 11, wherein the at least two lateral connecting belts comprise a first connecting belt and a second connecting belt, wherein the first connecting belt and the second connecting belt are lead from two opposite sides of the circuit board body, wherein the first connecting belt comprises a first connecting belt flexible plate and a first connecting belt hard plate, and wherein the second connecting belt comprises a second connecting belt flexible plate and a second connecting belt hard plate, wherein the first connecting belt hard plate forms the plurality of conductive holes, the plurality of electrical connection mediums are provided in the plurality of conductive holes respectively, the plurality of connecting belt pads are provided on an outer surface of the second connecting belt hard plate, wherein each of the first connecting belt and the second connecting belt is bent to enable the plurality of conductive holes of the first connecting belt hard plate of the first connecting belt is capable of being corresponded to the second connecting belt hard plate of the second connecting belt.

20. The circuit board for a camera module, as recited in claim 19, wherein the at least two lateral connecting belts comprise a third connecting belt comprising a third connecting belt flexible plate, wherein the first connecting belt flexible plate has a first bending portion and a second bending portion, the third connecting belt flexible plate has a third bending portion and the second connecting belt flexible plate has a fourth bending portion and a fifth bending portion, wherein the first bending portion is bent upwardly from a first side of the circuit board body, and the second bending portion is bent upwardly from the first side to the third side of the circuit board body so as to facilitate the first connecting belt flexible plate and the first connecting belt hard plate disposed on the third side of the circuit board body to be connected with each other; the fourth bending portion of the second connecting belt flexible plate is bent upwardly from a second side of the circuit board body, and the fifth bending portion is bent upwardly from the first side to the third side of the circuit board body, so as to facilitate the second connecting belt flexible plate and the second connecting belt hard plate disposed on the third side to be connected with each other, wherein the first side and the third side are opposite to each other.

* * * * *